United States Patent [19]

Harari

[11] 4,175,290
[45] Nov. 20, 1979

[54] INTEGRATED SEMICONDUCTOR MEMORY ARRAY HAVING IMPROVED LOGIC LATCH CIRCUITRY

[75] Inventor: Eliyahou Harari, Irvine, Calif.

[73] Assignee: Hughes Aircraft Company, Culver City, Calif.

[21] Appl. No.: 952,507

[22] Filed: Oct. 16, 1978

Related U.S. Application Data

[62] Division of Ser. No. 819,794, Jul. 28, 1977, Pat. No. 4,132,904.

[51] Int. Cl.$^2$ .............................................. G11C 11/40
[52] U.S. Cl. .................................. 365/156; 365/154; 365/181; 307/238
[58] Field of Search ............... 365/103, 104, 154, 156, 365/181, 182; 307/238, 279, 291

[56] References Cited

U.S. PATENT DOCUMENTS

| | | | |
|---|---|---|---|
| 3,882,467 | 5/1975 | Pricer | 365/156 |
| 4,095,281 | 6/1978 | Denes | 365/156 |

Primary Examiner—Terrell W. Fears
Attorney, Agent, or Firm—Elliott N. Kramsky; W. H. MacAllister; J. E. Szabo

[57] ABSTRACT

There is described a logic element employing fixed threshold and variable threshold transistors electrically connected together in a unique manner to form a latch. The latch can be made to retain data by keeping certain internal nodes at a high or low voltage level. As such it acts as an ordinary semiconductor memory latch, whose data can be changed by externally overriding the internal voltage levels of the latch cell. The novel results of the cell described are achieved by replacing one or several of the transistors in the latch by specially constructed transistors, whose threshold voltage can be raised or lowered upon application of a relatively high voltage pulse between their gate and substrate. By application of such a high voltage pulse, the data stored in the latch can be translated into controlled threshold shifts of the variable threshold transistors, which uniquely represent the initial latch state. Therefore, if power is removed and then returned, the latch will always settle into a state dictated by the final state that existed in the latch before the high voltage pulse was applied. In this way the variable threshold elements of the latch cell make it a non-volatile memory element. It can be used either as a read/write memory, using its latch property, or as a read-only memory, using the variable threshold transistors to cause it to always latch in a predetermined manner.

5 Claims, 32 Drawing Figures

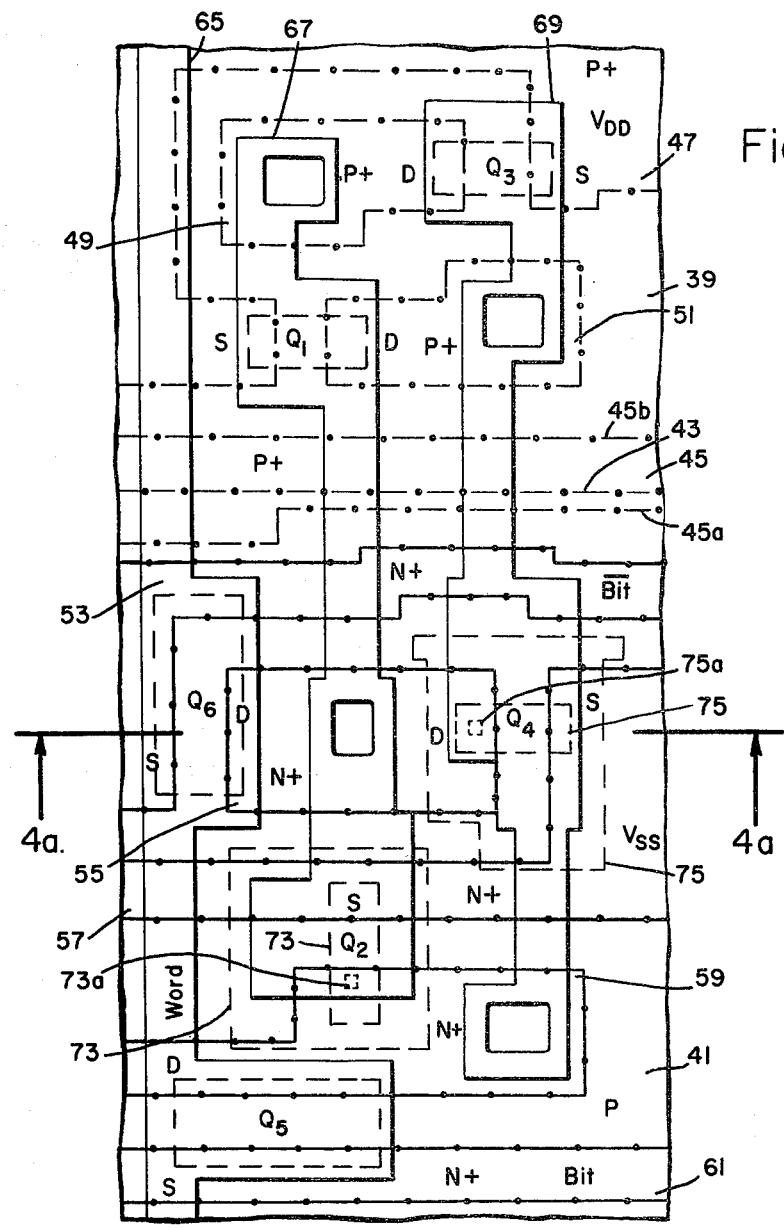

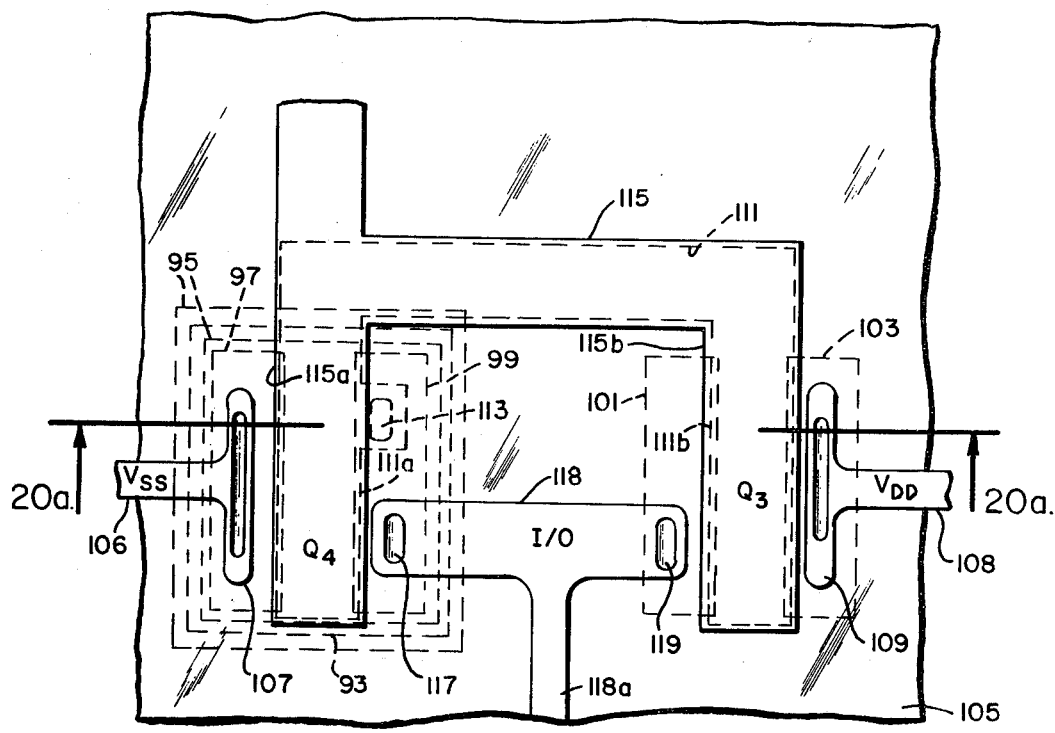
Fig. 20.
Fig. 20a.
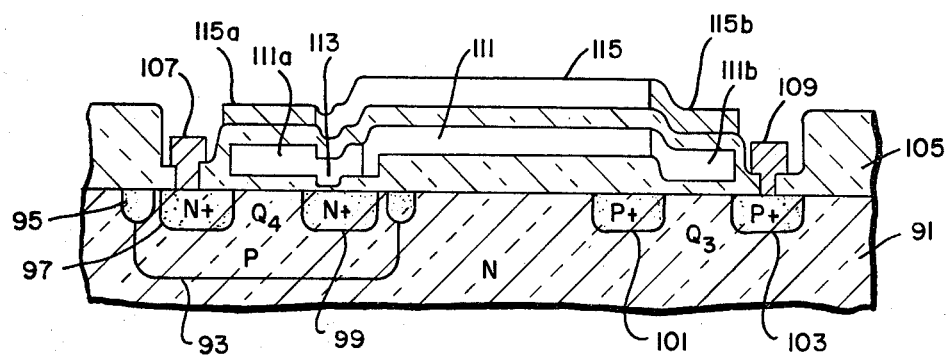

INTEGRATED SEMICONDUCTOR MEMORY ARRAY HAVING IMPROVED LOGIC LATCH CIRCUITRY

CROSS REFERENCE TO RELATED APPLICATION

The present application is a division of applicant's copending United States patent application Ser. No. 819,794 filed July 28, 1977 which issued as U.S. Pat. No. 4,132,904 for "VOLATILE/NON-VOLATILE LOGIC LATCH CIRCUIT". This United States patent is assigned to the assignee herein.

FIELD OF THE INVENTION

This invention relates generally to a semiconductor circuit element which can be used as a non-volatile memory storage cell, and which incorporates several types of MOS transistors having fixed and variable gate threshold voltages.

BACKGROUND OF THE INVENTION

Semiconductor memories can generally be divided into two groups—volatile and non-volatile. The first group is used far more frequently than the second. It employs dynamic or static logic elements and techniques to store bits of data in a pattern which can be changed externally almost any number of times (typical number of "write" cycles where the information in a cell is changed exceeds $1 \times 10^{14}$). The main problem with this group, of which two examples appear in FIGS. 1 and 1a is that memory storage is volatile, that is, power must be constantly applied to each memory cell to avoid loss of memory. Even though some advanced designs require very little power for memory retention, battery backup must still be used to provide for a possible power failure. Examples of such memories are the one-transistor-per-cell dynamic RAM (Random Access Memory) and the six-transistors-per-cell static RAM.

The second group of memories relies on special MOS devices to retain information for very long periods of time (on the order of tens of years) even with power removed. This is usually achieved by application of high voltage pulses to the gate or drain of the specially constructed transistor, which achieves through transfer and trapping of electric charges a semipermanent change of the transistor threshold voltage. The memory state is determined by the magnitude of this threshold voltage. The main problem with this group of memories is that the high voltage stressing required for writing (or erasing) rapidly degrades the memory device (a phenomenon known as "cycling fatigue"). Therefore, its threshold state can be changed only a limited number of times, typically $1 \times 10^6$ cycles. As such it is useful as a read-only or read-mostly memory, but not as a read/write memory. A further limitation of existing non-volatile memories such as MNOS (Metal-Nitride-Oxide-Semiconductor) and FAMOS (Floating Gate-Avalanche Injection MOS) is that writing of the non-volatile memory state requires relatively high voltage pulses and that they are slow, taking typically 1 to 10 msec to write each bit of information. This problem is greatly alleviated in a related non-volatile memory device disclosed by the present applicant in an application filed on Mar. 26, 1976 in the U.S. Patent Office Ser. No. 671,183 now U.S. Pat. No. 4,110,533. In this memory device write and erase operations are much more efficient, and result in write or erase high voltage pulse times of typically 1 to 10 $\mu$sec. However, these new memory transistors still suffer to some extent from cycling fatigue and would therefore not be used in applications other than where a read-only or read-mostly memory is required.

By incorporating the non-volatile memory transistors of the second group in a volatile memory cell of the first group it is possible to achieve a superior memory cell having the write/read characteristics of the first group and the non-volatility of the second group. This is basically a read/write volatile RAM where each memory cell is backed up by a second level of non-volatile memory element.

The most closely related prior art devices rely on MNOS variable threshold transistors to achieve non-volatility for the memory cell. One such prior art cell and its method of operation is described in U.S. Pat. No. 3,831,155 and is shown in FIG. 1b.

The same latch is described in an article "Memory Cells for N-Channel MNOS Arrays", presented at the Non-Volatile Memory Conference held in Vail, Colo. on August 1976 by F. Schuermeyer and C. Young from the Air Force Avionics Lab. The related memory cell described by these authors is named Static VINRAM (Virtual Non-Volatile RAM) and is shown in FIG. 1b, herein. The following brief description of that circuit is based on the article.

$Q_1$ and $Q_3$ are depletion mode MNOS transistors which are in the high conduction state for volatile operation. In the volatile mode the operation of the cell is identical to that of the volatile cell described by J. M. Schlageter et al, "A 4K STATIC 5V RAM", ISSCC 1976, paper 12.5, shown herein in FIG. 1a, with $V_{GG}=V_{SS}$. In order to transfer information stored in the volatile mode to information stored in the non-volatile mode or, in other words, to permanently store information which was previously stored so that it was subject to erasure in case of a power failure, a +25 volt 1 msec pulse is applied to the $V_{GG}$ line in FIG. 1b. Assuming that $Q_3$ is conducting and that consequently node $A=V_{SS}$ and node $B=V_{DD}=+10$ volts, the pulse so applied will cause the source of $Q_1$ to remain at $V_{SS}$ and consequently the total gate voltage to drop across its insulator, switching $Q_1$ into the low conduction (high threshold) state. Since the source and drain of $Q_3$ are both at the +10 volt potential, a depletion layer forms in Q which inhibits the writing of $Q_3$, causing it to remain in the high conduction state. In order to recover information stored in the non-volatile mode, +10 volts is applied to the drains of $Q_1$ and $Q_3$ ($V_{DD}$). Since $Q_3$ is in the high conduction state, node B will rise faster than node A, thus resetting the flip flop to its original position. After the flip flop has been set, $Q_1$ and $Q_3$ should both be erased. In order not to lose the volatile data, erasure should be performed with many short erase pulses (−25 volts gate-to-substrate) rather than one long pulse.

It is quite apparent that the FIG. 1b memory cell, while possessing the desired characteristics of a non-volatile read/write memory, is rather difficult to operate favorably because of the need for both positive and negative high voltage pulses to be applied to the chip to achieve the non-volatility feature. Further, as pointed out by Schuermeyer and Young, the erase operation must be carefully performed through a series of many short pulses at a high voltage (−25V), which in turn can result in unpredictable voltage and current spikes in different parts of the LSI chip, with possible, and difficult to predict, loss of the volatile data. The main problem is clearly due to the fact that each non-volatile writing operation must be followed by an erase operation before the next non-volatile write operation can be performed. The reason for this can be explained by examining a typical case for the memory cell of FIG. 1b. Assume that initially no information is written into the non-volatile mode. Then the two MNOS transistors $Q_1$ and $Q_3$ are in their high conduction state, both with thresholds of typically $-5V$. When the $+25V$ 1 msec pulse is applied to their gates in order to transfer the information from the volatile to non-volatile mode, it will cause one of the two, say $Q_1$ to change its threshold to typically $+2V$, leaving the threshold of $Q_3$ unchanged. If the volatile state (or information content) of the latch were now changed to opposite its initial state, it would not be possible to transfer this new information into the non-volatile mode because application of the $+25V$ 1 m sec pulse would simply result in $Q_3$ changing its threshold to $+2V$, with $Q_1$ remaining at $+2V$. In this new state, since both MNOS transistors have equal thresholds of approximately $+2V$, it is not possible to distinguish the last volatile state written into the latch. For this reason it is necessary to condition each memory cell to the MNOS low threshold (high conduction) state before each new non-volatile write operation so that only one of the two MNOS transistors will go to the high threshold state.

This conditioning by erasing all MNOS transistors is problematic because the high voltage negative pulses turn both MNOS load transistors $Q_1$ and $Q_3$ off, thereby cutting off power to the latch. Therefore, it is necessary to apply these $-25$ volt pulses in short bursts relying on contunuous storage on the capacitances of nodes A and B during the time the pulses are applied. A further problem with this approach is that for a large memory array employing the cells of FIG. 1b, the very large capacitive drive required to bring $V_{GG}$ up to $+25$ volts or $-25$ volts mandates a direct line to external drive circuitry, exposing any of the several thousand MNOS load transistors to static charge which, even if it will not cause outright shorts will, in any case, result in very large and unpredictable threshold shifts randomly distributed across the array. Furthermore, it may be altogether impossible to apply $-25$ volt and $+25$ volt pulses for short durations uniformly across the entire memory array. That is, because of the capacitances and resistances along the $V_{GG}$ line, some parts of this line will rise faster than others or reach a voltage closer to $-25$ volts or $+25$ volts than other parts so that erase or write will not be uniform across the entire array.

It is therefore a principal object of the present invention to provide a semiconductor latch circuit which is capable of either volatile or non-volatile information storage.

A more specific object of the invention is to provide such a circuit wherein the status of stored data may be changed from volatile to non-volatile by applying a single pulse thereto and without any need for an intermediate erase operation between successive non-volatile write operations.

These and other objects of the invention are attained by an integrated semiconductor latch circuit having a pair of branches, each including an insulated gate field effect transistor (IGFET) load and an IGFET driver connected in series drain to drain at a node. The control gate of the IGFET driver of each branch is cross-connected to the node of the other branch in order to provide a latch circuit capable of volatile information storage. Non-volatile information storage in accordance with the present invention is made possible by making the threshold voltage of at least one of the IGFETs electrically variable, preferably but not necessarily by providing it with a floating gate having a thin oxide area over the node to which the IGFET is connected. An IGFET having such a floating gate will hereinafter be referred to as a FATMOS (Floating Gate Thin Oxide Tunneling) transistor and the resulting latch circuit will be referred to as a NOVRAM (Non-volatile Random Access Memory) latch. A NOVRAM latch in accordance with the present invention may have either a pair of variable threshold drivers in combination with a pair of fixed threshold IGFET loads or alternatively a pair of fixed threshold IGFET drivers combined with a pair of variable threshold transistor loads. In either case volatile information storage is accomplished by normally maintaining a supply voltage across both branches which is below that required to change the thresholds of the variable threshold transistors and by turning on one or the other driver so as to set the latch in one of its two stable states. The latch will remain in that state so long as the required supply voltage continues to be applied across its branches.

To permanently store the volatile information in non-volatile form the supply voltage previously applied across the two branches of the latch is briefly raised to a higher level which is sufficient to change the thresholds of the variable threshold transistors. This will result in equal but opposite threshold shifts in the two variable threshold transistors so that, if power is removed from the latch after the non-volatile writing operation, the information which had been stored in the latch prior to that operation will be retained in the form of their threshold shifts. When power is next applied to the latch the branch containing the transistor whose threshold was lowered will turn on first and will cause the other variable threshold transistor to be turned off, an effect which will be reinforced by the increased threshold level of that other FATMOS transistor.

In some applications a latch as described might have excessive current drain for reasons which will be explained in greater detail hereinafter. Basically, such current drain might be due to the fact that during non-volatile writing when the high voltage pulse is applied to bring about a threshold shift in the variable threshold transistors, one of them may be shifted into a negative threshold state in which the device will conduct even when a zero bias is applied to its control gate (depletion mode operation). In accordance with a further object and feature of the present invention this drawback is eliminated by adding an additional IGFET, whose threshold remains constant, in series with each of the variable threshold transistors. Consequently, even when a particular variable threshold transistor has its threshold shifted into depletion mode operation, the branch containing it will be prevented from drawing excessive current by the additional constant threshold transistor which will not be biased into conduction at the same time.

A further specific object and feature of the present invention is to simplify the basic NOVRAM latch circuit by using a variable threshold transistor in only one of its branches to achieve non-volatility, rather than to use one in each branch.

Use of only a single variable threshold transistor per NOVRAM latch results in significantly improved yields, particularly when that transistor is a FATMOS, since the thin tunneling oxide between the floating gate and the substrate of a FATMOS transistor is a major yield reducing factor, particularly in very large memory arrays. By using only one FATMOS transistor per latch instead of two, the total area of thin oxide for a given memory array is halved and so is the probability of a pinhole which could ruin an entire chip containing the memory array.

Yet another related object and accomplishment of the present invention is to improve upon the previously mentioned NOVRAM latch embodiments wherein the variable threshold transistor is a FATMOS by extending the floating gate of the variable threshold FATMOS transistor (typically the driver) into the channel region of its associated IGFET load which in this case will be of the opposite conductivity type. As a result, both the load and the driver will have a variable threshold which will shift by equal amounts as a result of a non-volatile (high supply voltage) write operation. Because the load and driver are of opposite conductivity types, the mutually reinforcing effect will be similar to that obtained by using one FATMOS transistor in each branch but will be achieved by using only a single thin tunneling oxide area. Thus, while this feature of the invention yields the performance advantages of the basic two-FATMOS transistor cell, it does so at a significantly higher yield, since it requires only a single tunneling oxide area per cell.

These and other objects and advantages of the invention will be described in greater detail by reference to the drawings, in which:

FIG. 3b is the symbol used herein to depict the FATMOS transistor illustrated in FIGS. 3 and 3a;

FIGS. 4 and 4a are plan and cross-sectional views of a semiconductor chip portion in which there has been fabricated the circuit illustrated in FIG. 2a;

Figure 15:
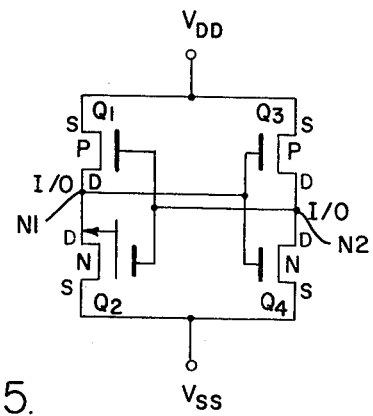
FIG. 15 is a schematic diagram of an improvement on the basic NOVRAM latch circuit wherein only one of the IGFET drivers has a variable threshold voltage.
Figure 19:
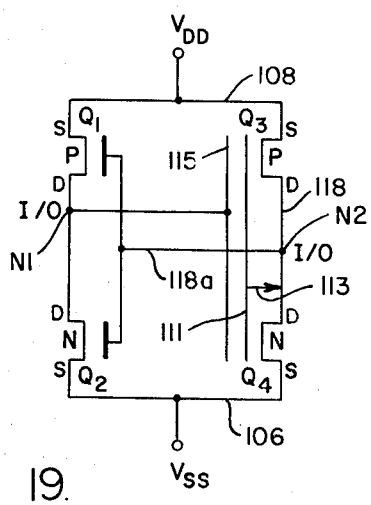
Figure 21:
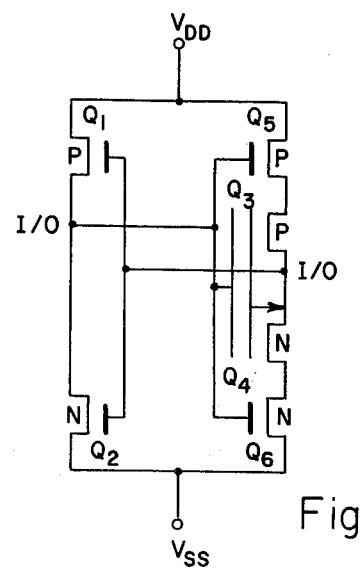

FIG. 19 is a schematic diagram of a NOVRAM latch which like the circuit of FIG. 15 has only a single variable threshold voltage (shown as a FATMOS) transistor but is an improvement thereon in that the floating gate of that transistor extends into the channel area of the IGFET transistor which is in series with the FATMOS transistor so as to provide a pair of variable threshold transistors in the same branch;

FIGS. 20 and 20a are plan and cross-sectional views of a semiconductor chip in which there has been fabricated a FATMOS transistor whose insulated gate extends into the channel area of an adjacent IGFET transistor and which might be used to implement the circuit illustrated schematically in FIG. 19; and FIG. 21 is a schematic diagram of an improved NOVRAM latch circuit similar to that shown schematically in FIG. 19 but with the addition of an IGFET transistor in series with the FATMOS driver and its associated IGFET load so as to limit current in the branch containing those devices.

Figure 1:
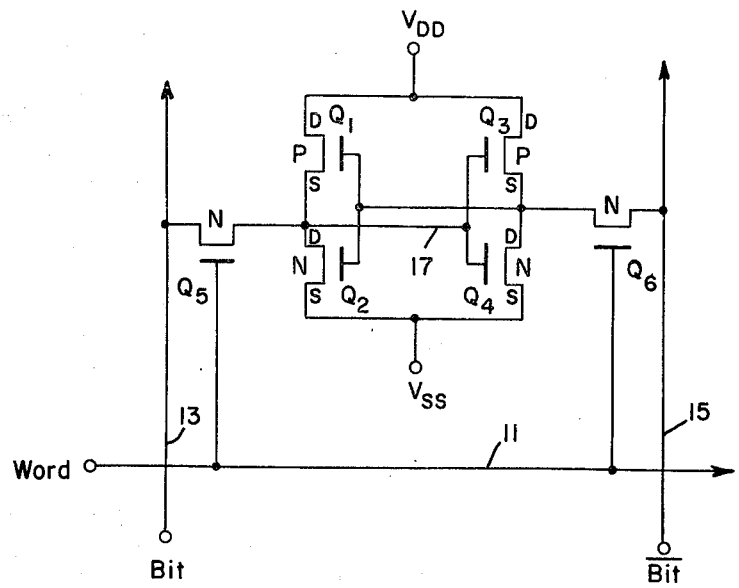
FIGS. 1 and 1a are schematic diagrams of two different types of prior art latch circuits used for volatile information storage.
Figure 1A:
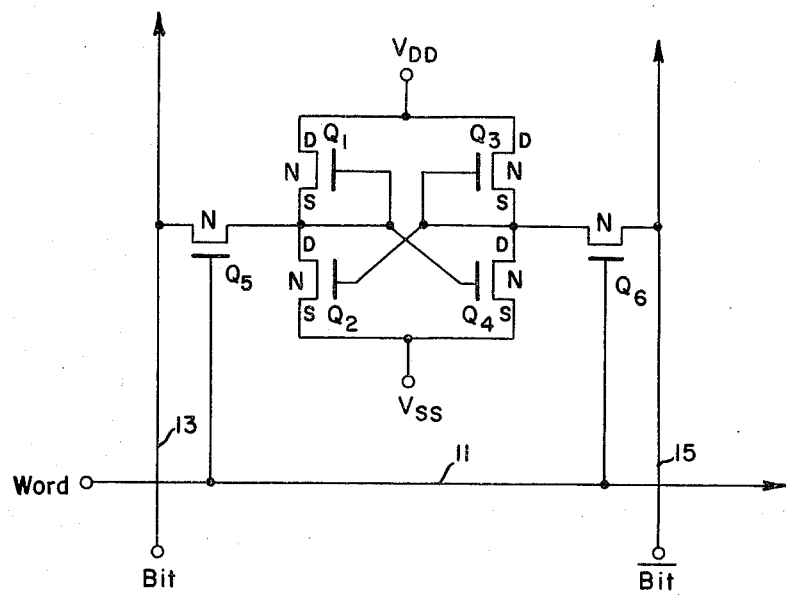

Turning now to the specification, FIGS. 1 and 1a disclose two similar prior art volatile memory latches, both comprising six transistors. The FIG. 1 latch is implemented in CMOS technology in which the latch has two branches, each comprising a CMOS inverter having two opposite conductivity type IGFETs, $Q_1$ and $Q_2$ in one branch, $Q_3$ and $Q_4$ in the other branch. The conductivity types and the sources and drains of the various transistors, $Q_1$ through $Q_6$, are identified by the appropriate initial letters. Typical voltages for $V_{SS}$ and $V_{DD}$ are zero and +10 and information is stored in the latch by activating the world line 11 so as to turn on the input transistors $Q_5$ and $Q_6$, both of which are shown as N-channel devices, and by applying a turn on voltage to one or the other of the Bit and $\overline{\text{Bit}}$ lines 13 and 15. A suitable convention is to assume that a logic 1 on a given one of the lines 13 and 15 is represented by raising that line to $V_{DD}$ and that a logic 0 on the line is represented by maintaining the line at $V_{SS}$. Of course, whenever one of the lines 13 and 15 is at logic 1 the other one of those lines will be at logic 0. Assuming then that line 15 is at logic 1 and that transistors $Q_5$ and $Q_6$ have been enabled, the gates of $Q_1$ and $Q_2$ will be pulled up to $V_{DD}$, causing $Q_2$ to turn on and $Q_1$ to turn off because of their opposite conductivity types. With $Q_2$ turned on its drain drops to $V_{SS}$ and through the cross-coupling connection 17 turns off $Q_4$, while turning on $Q_3$. So long as power is maintained, the state of the latch remains where it has been set, with $Q_2$ and $Q_3$ biased into conduction and $Q_1$ and $Q_4$ being cut off. The steady state current drawn in the latch is minimal since both branches contain a nonconducting transistor, a feature characteristic of CMOS circuits. The information can be sampled by interrogating the circuit through the transistors $Q_5$ and $Q_6$.

The FIG. 1a circuit is that described in the above-referenced article by Schlageter et al. It too comprises six IGFETS, $Q_1$ through $Q_6$, all of which however are N-channel devices. Significantly, the load transistors $Q_1$ and $Q_3$ are depletion type N-channel transistors whereas the driver transistors $Q_2$ and $Q_4$ are enhancement type devices. The depletion load transistors $Q_1$ and $Q_3$ have their gates connected to their sources, rather than to the gates of their respective drivers. As a result they act as constant current sources to their respective driver transistors. Latching action is accomplished as with the FIG. 1 circuit by cross-coupling the gate of the driver transistor of a given branch to the node at which the load and driver transistors of the other branch are joined. Consequently, application of a given information input signal on the lines 13 and 15 will result in turning on the driver transistor of the same branch just as it would if it were applied to the FIG. 1 circuit. Greater simplicity of fabrication is the main advantage of the FIG. 1a circuit over that of FIG. 1 since only one conductivity type of device is involved. This, however, is obtained at the cost of greater current consumption since there will be a finite current drain in one of the branches of the FIG. 1a memory latch at all times.

Figure 1B:
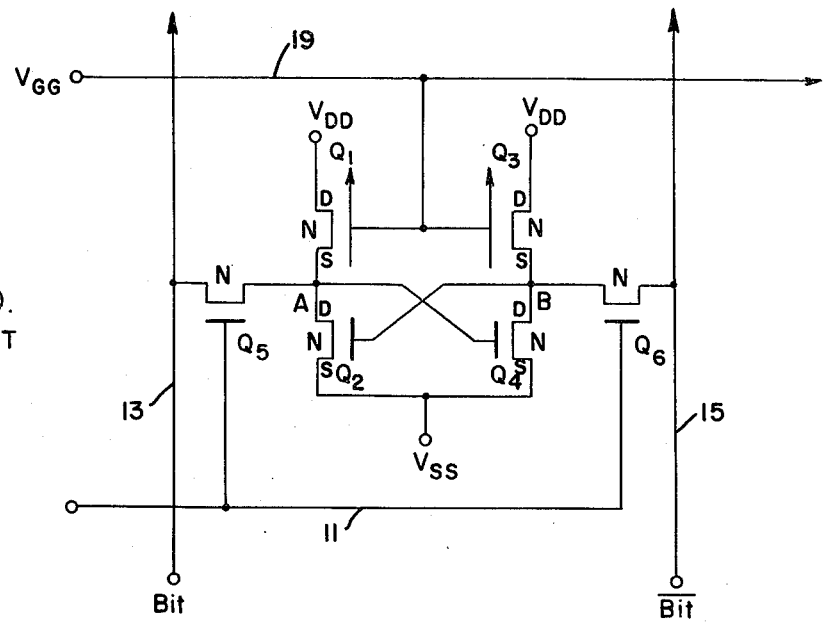
FIG. 1b is a schematic diagram of a prior art latch circuit which is an improvement over that illustrated in FIG. 1a in that it is capable of either volatile or non-volatile information storage.

An improvement over the volatile memory latch circuit of FIG. 1a is illustrated in FIG. 1b. It was discussed in detail previously. Basically, its operation is the same as that of the FIG. 1a circuit for volatile information storage which is accomplished by applying appropriate signals to the circuit over lines 11, 13 and 15. The improvement which enables the FIG. 1b circuit to store information in non-volatile form is accomplished by using MNOS variable threshold transistors for the transistors $Q_1$ and $Q_3$ in place of the fixed threshold transistors used in the FIG. 1a circuit. Volatile information is stored by setting the flip flop into one or the other of its stable states in which either $Q_2$ or $Q_4$ conducts. Non-volatile information storage is effected by briefly raising the $V_{GG}$ voltage on the line 19 which will have the effect of shifting the threshold of one of the two MNOS transistors $Q_1$ and $Q_3$, the one being that which is in series with the conducting one of the driver transistors $Q_2$ and $Q_4$. Consequently, when the non-volatile information is subsequently retrieved by reapplying $V_{GG}$ at its lower level to the line 19, the latch will reset itself into its original state for the reasons previously explained.

The shortcomings of the FIG. 1b circuit have also been described in some detail. Briefly, they include the need to erase the threshold shift on that particular one of the two transistors $Q_1$ and $Q_3$ affected by the last non-volatile storage operation before information can be again stored in non-volatile form. This erase operation requires a burst of high voltage pulses of critical time duration which tend to have an adverse effect on the reliability and life of the latch circuit. Furthermore the FIG. 1b circuit requires an additional power line ($V_{GG}$), which uses up unnecessary space. Because of the necessity to apply high positive and negative voltage pulses to $V_{GG}$, it is difficult to create for the input pad of this line proper protection from spurious high voltage pulses which may cause dielectric breakdown to any of the many load transistors sharing $V_{GG}$ as their gate line.

Figure 2A:
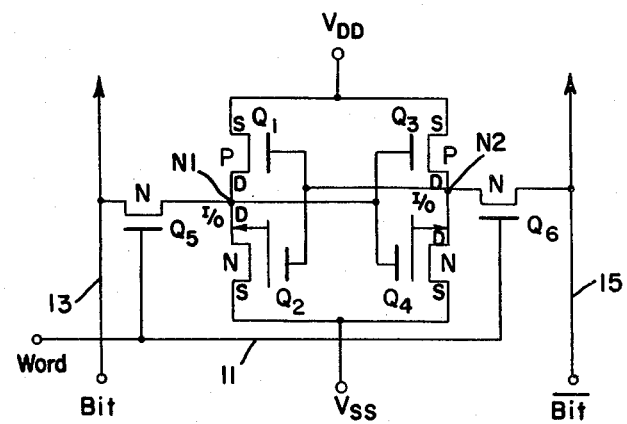
FIGS. 2a and 2b are alternative forms of a latch circuit made in accordance with the present invention and having FATMOS transistors as their drivers and loads, respectively.

FIG. 2a illustrates one possible embodiment of the present invention which is free of the drawbacks of the FIG. 1b circuit, yet shares its advantage of both volatile and non-volatile information storage capability. Essentially, the FIG. 2a circuit is identical to that illustrated in FIG. 1, except for the important fact that the transistors $Q_2$ and $Q_4$ are variable threshold voltage transistors. Although the FIG. 2a circuit of the present invention modifies a prior art circuit (FIG. 1) in a manner analogous to that in which the FIG. 1b prior art circuit modifies its predecessor (FIG. 1a), it will become apparent as this description proceeds that the circuit modification suggested by the present invention yields an entirely different type of circuit operation than that yielded by the FIG. 1b prior art circuit and has unique and unexpected advantages over that circuit.

Before comparing the relative advantages of the FIG. 2a and FIG. 1b volatile/non-volatile memory latch circuits, it will be helpful first to review briefly a preferred type of variable threshold voltage transistor for use in latch circuits in accordance with the present invention. One embodiment of such a preferred variable threshold transistor is illustrated in plan and cross-sectional views in FIGS. 3 and 3a and symbolically in FIG. 3b. Such a transistor is described and claimed in the above-referenced patent application of the present inventor, said application being incorporated herein by this reference. The present FIGS. 3 and 3a are based on the embodiment disclosed in FIG. 7 of that application. Briefly, it is formed in P-type silicon region 21 which in a CMOS circuit such as that of FIG. 2 will normally itself be a part of a larger N-type silicon substrate. Such a P-type region is referred to in the art as a "P well". Spaced apart source and drain regions 23 and 25 of opposite conductivity type are formed in the surface of the P well 21 by conventional means, the area between them being the channel 24 over which conduction is selectively established between the source and the drain. A protective insulating layer 26 preferably, but not necessarily an oxide/nitride two layer composite, overlies the entire source-to-drain circuit, with the source and drain being respectively connected to outside circuitry through a pair of metal contacts 27 and 29 which extend to them through the layer 26.

Overlying the insulating layer 26 and covering the entire channel region 24 is a metal control gate 31 whose function is to selectively render the channel region 24 conductive by attracting a layer of electrons in response to the application of a positive supply voltage to the control gate. Interposed between the control gate 31 and the surface of the P well 21 is a second gate 33 which is totally isolated electrically from all other elements by the insulating layer 26 and which for that reason is referred to as a "floating gate". A selected area 35 of the floating gate 33 dips closer to the substrate surface so that the thickness of the oxide between the floating gate and the substrate is substantially reduced. This area 37 is designated as the thin tunneling oxide because it brings the floating gate 3 sufficiently close to the silicon substrate to make possible the use of tunneling as a conduction mechanism for transferring charges between the floating gate 33 and the semiconductor body and in particular its drain region 25. It will be understood of course that if the variable threshold device illustrated in FIGS. 3 and 3a is to be part of an all N-channel circuit, it will be formed in an all P conductivity type substrate directly and that the comments directed at a P well herein will then apply to that all P conductivity type substrate. Similarly as will be discussed later it may be desirable to implement the variable threshold transistor of FIGS. 3 and 3a as a P channel device, in which case it will be formed directly in the N conductivity type semiconductor substrate.

The transistor of FIGS. 3 and 3a is capable of two modes of operation. In its regular mode its source and drain 23 and 25 are connected to external circuitry so that one of them is positive relative to the other. The control gate 31 is maintained at either one of two potentials. At the first potential, which may be assumed to be 0 volts relative to the substrate 21, the control gate has no effect on the conductivity of the device which, as a result, is nonconductive in that state. When it is desired to turn the device on, a more positive voltage typically +5 to +10 volts is applied to the control gate 31 which induces an inversion layer of electrons to collect in the channel region 24 turning the device on and creating a very low resistance path in the source to drain circuit of the device.

To operate the device in its second mode, a significantly higher voltage, typically +15 to +25 volts is applied to its control gate 31 which will be sufficient to induce tunneling between the substrate 21 and the floating gate 33 through the thin oxide region 37. During this brief tunneling episode, charges will move on to the floating gate 33, initially over the thin oxide region 37, but will quickly distribute themselves over the entire floating gate since it is a good conductor. Typically it will be fabricated from doped polycrystalline silicon while the control gate 31 will usually be metal, although it too could be doped polycrystalline silicon. The charges thus deposited on the floating gate 33 will be retained on it for extremely long periods of time, on the order of tens of years because they will have no path through which to escape, the floating gate 33 being totally surrounded by the insulating dielectric layer 26. The effect of a layer of electrons on the floating gate 33 during subsequent operation of the device will be to alter its threshold, since the electrons will have the effect of repelling electrons from the surface of the substrate in its channel region 24, thus increasing the turn-on threshold voltage of the device. To return the device to its original state, the trapped charges may be removed from the floating gate 33 by applying a potential between the control gate 31 and the substrate 21 equal to that used to create the trapped charges but opposite in polarity. This will cause the trapped charges to tunnel from the floating gate 33 through the thin oxide region 37.

In keeping with the invention described in greater detail in the above-referenced application, the portion 35 of the floating gate 33 which defines the thin oxide region 37 occupies a significantly smaller area than that defined by the entire gate. This is a decided advantage over previous floating gate variable threshold devices because it reduces the area of the thin tunneling oxide 37 which is prone to suffer from pinholes which in turn might result in the breadown of the device. While the tunneling oxide area 37 has been shown in FIGS. 3 and 3a to extend over the drain-to-substrate junction and into the channel area 24, it may, as an alternative, be entirely over the drain region 25, and, indeed, this is the most preferred location for the thin oxide region 37, as shown in FIG. 4. Stating it differently, for implementing the NOVRAM latch circuits of the present invention, FATMOS transistors may be used as the variable threshold elements. If they are so used, their tunneling oxide areas 37 must be either entirely over their drains 25 or partially over their drains and channel regions 25 and 24. The thickness of the oxide in the area 37 will typically be in the range of 20 to 100 angstoms. The size of that area should be as small as possible in order to reduce the effect of pinholes.

Figure 3:
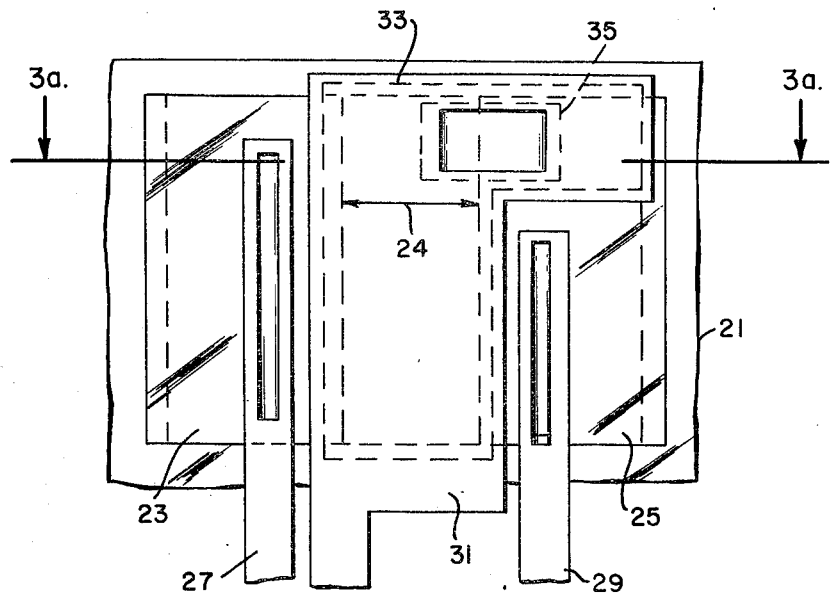
FIGS. 3 and 3a are plan and cross-sectional views of the FATMOS transistor used in the circuits of FIGS. 2a and 2b.
Figure 3B:
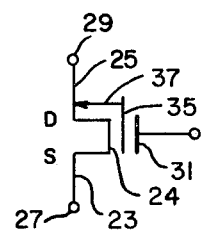

FIG. 3b is the symbol which has been adopted for representing a variable threshold transistor of the FATMOS type which is illustrated in FIGS. 3 and 3a. The symbol includes representations of the source and drain 23 and 25, the thin oxide 37 near the drain 25, the floating gate 35 extending over the channel 24 and the control gate 31 covering at least part of the floating gate 35.

Returning now to the FIG. 2a embodiment of the present invention, its operation will next be described with reference to the timing diagram of FIG. 5. In referring to the circuit, the transistors $Q_2$ and $Q_4$ will be referred to as FATMOS transistors whose symbols indeed are those used for the transistors. It should be understood, however, that the present invention is sufficiently broad to find applicability to other variable threshold transistors as well. Initially, both FATMOS transistors $Q_2$ and $Q_4$ have the same threshold voltage $V_T$, as do the two fixed threshold load transistors $Q_1$ and $Q_3$. The state of the latch circuit is set so as to store either a binary 1 or a binary 0 by enabling the two "word" line transistors $Q_5$ and $Q_6$ and bringing the Bit and $\overline{\text{Bit}}$ lines to 1 and 0 or 0 and 1, respectively. It may be assumed that a logic 0 is represented on a given one of the lines 13 and 15 by applying a $V_{SS}$ voltage level to that line and that a logic 1 level is represented by bringing that line to a $V_{DD}$ voltage level where $V_{SS}$ is the potential maintained on the sources of the drive transistors $Q_2$ and $Q_4$ and is typically at 0 volts while the potential $V_{DD}$ is that applied to the sources of the load transistors $Q_1$ and $Q_3$, a level which is typically +5 or +10 volts.

The voltage $V_{DD}-V_{SS}$ across the two branches of the latch is maintained at a level which is sufficient for operation in the volatile storage mode but is less than that required to cause tunneling in the transistors $Q_2$ and $Q_4$. The latch will be set in the manner explained previously with reference to the prior art circuit of FIG. 1 and once it is set it will remain so, as long as $V_{DD}-V_{SS}$ does not drop below approximately 1.5 volts. Thus, assuming for example that, at some time between $t_o$ and $t_1$, a logic 0 is signaled on the $\overline{\text{Bit}}$ line 15 and a logic 1 on the Bit line 13, the resulting $V_{DD}$ level at node $N_1$ will turn on the drive transistor $Q_4$, which in turn will shut off the other drive transistor $Q_2$. Because of their gate connections, the transistors $Q_1$ and $Q_3$ will be on and off, respectively. As a result, neither branch of the latch circuit will conduct in its quiescent state. To interrogate the latch circuit for its information, the word line 11 is enabled, turning on the word transistors $Q_5$ and $Q_6$ and permitting the voltage levels of the nodes $N_1$ and $N_2$ to be sensed through them. The state of the latch can be changed at will by applying a different set of logic state signals to the Bit lines 13 and 15. Since these signals are at a level which is not sufficient to cause permanent threshold voltage change in the variable threshold FATMOS transistors $Q_2$ and $Q_4$, typically not more than 10 volts, the threshold state of the transistors $Q_2$ and $Q_4$ remains unchanged.

When it is desired to permanently store, in non-volatile form the information at the nodes $N_1$ and $N_2$ of the latch, the voltage $V_{DD}-V_{SS}$ across the two branches of the NOVRAM latch is raised to a second level which is sufficiently high to cause tunneling across the thin oxide areas of the FATMOS transistor drivers $Q_2$ and $Q_4$, causing a change in their threshold voltage. This, of course can be accomplished either by raising $V_{DD}$, or dropping $V_{SS}$, or both. For purposes of this description it will be assumed that the entire voltage change is accomplished by raising $V_{DD}$. Typically, a voltage pulse of +20 volts applied for 10 microseconds will result in a 2 to 3 volt shift in the threshold voltage. As $V_{DD}$ is raised from +10 volts to +20 volts, seen to occur in FIG. 5 between times $t_1$ and $t_2$, the nodes $N_1$ and $N_2$ maintain their previous logic state, with one node remaining at $V_{SS}$ and the other rising to +20 volts. Since both of these voltages are cross-coupled to the control gates of the FATMOS transistors $Q_2$ and $Q_4$, it is apparent that the tunneling field in one of those transistors will be equal in magnitude but opposite in direction to that in the other. Assuming, for example, that when the non-volatile writing operation was initiated $Q_4$ was in conduction and $Q_2$ had been cut off, then during the non-volatile writing operation, node $N_2$ will remain at $V_{SS}$ while node $N_1$ will rise with $V_{DD}$ from +10 volts to +20 volts. Consequently, the gate-to-drain voltage on $Q_4$ will rise to +20 volts while the gate-to-drain voltage across $Q_2$ will also rise, but from −10 volts to −20 volts. And, where the threshold voltage of one of the two transistors $Q_2$ and $Q_4$ has ben increased by, let us assume, 2 volts, the threshold voltage of the other one of the transistors will be reduced by an approximately equal amount, so that the two threshold shifts will reinforce each other.

What is important to note is that it is soley the state of the latch circuit at the time when $V_{DD}$ is raised for non-volatile storage which dictates which of the transistors $Q_2$ and $Q_4$ shall have a positive threshold shift and which shall have a negative threshold shift. In the case just assumed, it will of course have been the transistor $Q_4$ which was conducting just prior to the non-volatile writing step and whose threshold will be increased. Moreover, unlike the prior art circuit of FIG. 1b, the NOVRAM latch does not require that high voltage pulses of both polarities be applied to it. The +20 volts and −20 volt levels required internally in the latch are derived by it from a single +20 volt supply because of its cross-coupling, which reflects the needed field polarities of its tunneling oxide areas.

As stated before, the threshold voltage shifts of the FATMOS transistors $Q_2$ and $Q_4$ will be permanent over several years at room temperature, but they can be reversed by application of a subsequent pulse, on the order of 20 volts, for approximately 10 microseconds on the $V_{DD}$ line. At the end of the permanent writing pulse, the power on the $V_{DD}$ line can be turned off ($t_2 \rightarrow t_3$) and, when it is switched back on again, the circuit will automatically latch in a distinct state which is dictated by the difference in the threshold voltages caused by the threshold voltage shift during the non-volatile writing operation.

It is apparent from the foregoing description of its operation, that the FIG. 2a circuit will latch into a state which is always opposite that which existed prior to the high voltage or non-volatile writing operation. Thus, where initially $Q_4$ has been in conduction, as assumed hereinabove, when power is returned, beginning in FIG. 5 at time $t_3$ and reached at time $t_4$, it will lag significantly behind $Q_2$ in its tendency to turn on, because the threshold voltage of $Q_4$ was increased while that of $Q_2$ had been reduced by the high voltage writing operation. In fact, because of this threshold shift, $Q_2$ will turn on first, which will immediately shut off $Q_4$, and this will be the state of the latch for the remainder of the time that $V_{DD}$ continues to be applied to the circuit ($t_4 \rightarrow t_5$). This need not be a problem since, in an array of memory latching circuits or cells, each and every cell would have its state equally inverted. At any rate, the true or non-inverted state can be reinstated simply by repeating the high voltage writing sequence, which is shown to occur between times $t_5$ and $t_6$.

The magnitude and duration of the high voltage pulse on $V_{DD}$ necessary to achieve non-volatile write or erase will generally depend on several parameters of the FATMOS transistor itself. The most important parameter is the thickness of the thin tunneling oxide region 37. Another important parameter is the composition and the thickness of the dielectric between the control gate 31 and the floating gate 33. A further important consideration is the area of overlap between the control gate 31 and the floating gate 33, as well as the area of the tunneling oxide region 33. These affect the ratio of capacitive coupling between the drain 25 and the floating gate 33 on the one hand, and the the capacitive coupling between the floating gate 33 and the control gate 31 on the other hand. The latter two will be discussed in greater detail with reference to FIG. 14, where they are better shown as $C_{FD}$ and $C_{FG}$ respectively. All of these parameters can be selected at will during processing of the device. Once they have been established by selecting certain processing steps, it will be possible to achieve non-volatile write and erase at any of several voltage levels, there being a possible trade off between the magnitude of the voltage and its duration. For a given threshold to shift either in the positive or negative direction, it will be necessary to apply a gate to drain voltage of between +12 volts and +25 volts. The necessary duration of the voltage will depend on its magnitude, so that typically if a +12 volt pulse has been applied, it will have to be maintained for approximately 10 milliseconds, whereas a 1 microsecond duration will be sufficient to achieve the same threshold shift where the magnitude of the pulse is +25 volts.

The voltage level to be applied in a system will depend to a great extent on the time available to perform a non-volatile write or erase operation. It may also depend on the processing of the memory array, which would operate more reliably at the lower voltage level, that is if only +12 volts or −12 volts were required to achieve non-volatile write or erase, respectively. The probability of short circuits occurring at the lower voltage is far less than if the higher voltage of +25 volts were selected. On the other hand, if the FATMOS transistors $Q_2$ and $Q_4$ were processed so as to sustain a threshold voltage shift even at +12 volts gate to drain, this could become a disadvantage during normal volatile read and write operation, since the voltage at which they would have to be carried out would be limited as a result to avoid unintentional erase. Thus, if for example, non-volatile write were achieved at +15 volts in 1 microsecond, implying a very efficient FATMOS transistor, then if volatile operation were to take place at +10 volts gate to drain, the device which responds to ±15 volts gate to drain by sustaining a threshold voltage shift will respond less efficiently, but still noticeably, to a +10 gate to drain voltage and will initiate erasure of itself in response to the normal operating voltage of +10 volts when it should really not change its threshold voltage at all. In short, in order to avoid ambiguity, the voltage at which theshold shift occurs should be significantly higher than the normal operating voltage in the volatile mode of the inventive latch circuit.

It has been found desirable to keep the $V_T$ difference induced by the high voltage pulsing fairly small, typically 1 volt. By so doing it becomes possible to override externally (through the Bit and $\overline{\text{Bit}}$ lines 13 and 15), the information stored in the latch by using its push-pull property to overcome the threshold voltage imbalance. Thus, the cell can be used interchangeably, either as a static random access memory (RAM) cell whose information can be changed at the standard 5 or 10 volt level or as a programmable read-only memory (PROM) cell, used for reading repeatedly information which has been permanently stored by virtue of the electrically induced and programmed threshold voltage imbalance. In other words, the memory circuit of FIG. 2a is capable of concurrently storing information on two levels. On one level will be information permanently stored in the cell and on another level will be information stored only temporarily. Temporarily stored information can be repeatedly updated and changed without disturbing the underlying permanently stored information which is brought out by appropriately interrogating the cell.

In a typical application a memory array comprising the novel circuit of FIG. 2a would be used as a static RAM. When power was about to be turned off or when power failure was being sensed, $V_{DD}$ would be momentarily raised to +20 volts, causing all the information in the array to be permanently stored in the form of changed threshold voltages in the $Q_2$ and $Q_4$ FATMOS transistors. Subsequently, when the power is restored, information last written into the RAM would appear in inverted or complementary form at each cell of the array. Because the necessary tunneling action to change the threshold voltages of $Q_2$ and $Q_4$ involves extremely small currents (typically less than 1 microamp for a large memory array) it should be relatively simple to generate the +20 volt pulse on the chip comprising the memory, by voltage multiplication from the +5 volt level, or to discharge a small external capacitor held at +20 V.

As mentioned previously, the inventive latch, of which one embodiment is illustrated in FIG. 2a, has two levels of storage, one temporary, or volatile, and the other permanent, or non-volatile. Normally, the latch is operated in the volatile mode in which information is fairly frequently updated, but is subject to loss in the event of a power failure. The other mode is typically initiated when a power failure is about to occur, in which case the $V_{DD}$ voltage is raised to a high enough level to cause a threshold voltage shift sufficient to give the device a memory or recollection of the information which it contained just before the voltage was so raised so that, even if power is lost after the threshold shift, when power is reapplied, the circuit will be turned on in a state which reflects the information which it had just prior to the non volatile writing operation. Once the device has been turned on, it can again receive information in volatile form which, as just explained, can be made to override the threshold shifts of transistors $Q_2$ and $Q_4$ which will still be present. If, however, power should be lost again, the circuit would still have its original recollection of the non-volatile information which had been stored in it by the high voltage threshold shifting pulse on $V_{DD}$. In other words, its permanent non-volatile information content would not be affected by any subsequent temporary or volatile writing of information into it. Rather, it would be changed only by a subsequent non-volatile writing operation.

If one wishes to determine the permanent or non-volatile information content of all the latches in a memory array comprising several rows and columns of NOVRAM latches, it is sufficient to simply turn off the power to the memory and then turn it back on again, in which case all of the memory cells or latch circuits will assume their permanently programmed states. But to recover the non-volatile information stored only in selected ones of the cells of the memory, without disturbing the volatile information stored in the remaining cells, this operation will not suffice, since they are all connected to the same $V_{DD}$ line. In keeping with the present invention, however, it is possible to selectively interrogate certain ones of the NOVRAM cells in a memory array simply by applying identical voltage pulses to both nodes N1 and N2 of the latch and this can be done selectively through the word line 11 and BIT AND $\overline{\text{BIT}}$ lines 13 and 15. It does not matter whether the pulses represent logic 1's or logic 0's, so long as they are the same. Application of a pair of similar pulses to the nodes $N_1$ and $N_2$ of a selected NOVRAM latch will have the effect of selectively obliterating the volatile content of the interrogated latch and in the setting of the latch into the state dictated by its non-volatile information content as stored by the threshold voltage shifts of its FATMOS transistors $Q_2$ and $Q_4$.

The FIG. 2a circuit is characterized by the fact that it is the drivers $Q_2$ and $Q_4$ which have variable thresholds. It will be seen upon reflection that the advantages just described with reference to that circuit will also flow from an alternative thereof shown in FIG. 2b in which it is the loads $Q_1$ and $Q_3$ which are made with variable threshold voltages.

A better appreciation for the physical configuration of the FIG. 2a circuit will be gained by referring to FIGS. 4 and 4a which represent an actual circuit formed in an N-type silicon substrate 39. The drawings are to scale but magnified many times. Formed in an N-type silicon substrate 41 is a P well formed conventionally by counter doping the N-type substrate 39. The line 43 marks one edge of the P well and is bracketed, as seen in FIG. 4, by a P+ type guard band 45 whose own borders are designated by the lines 45a and 45b. Additional P+ regions in the N-type substrate 39 include the strip 47, which is seen to form a border at the top of FIG. 4, and the two interfacing L-shaped areas 49 and 51.

Located within the P well 41 are N+ regions 53, 55, 57, 59 and 61. Covering the substrate surface over both the N and P regions thereof is a layer of thick oxide 63 which is thinned over the channel regions of each of the transistors $Q_1$ through $Q_6$, as shown by areas 63a and 63b of FIG. 4a. The channel area of each transistor is shown by a dashed rectangle which surrounds the symbol (e.g., $Q_4$) of that transistor in FIG. 4. An optional nitride layer 64 overlies the oxide layer 63.

Extending over the oxide layer 63 are three metal strips 65, 67 and 69. They dip close to the surface of the substrate 41 where the oxide 63 is thinned, as at 63a and 63b, and in these areas the metal strips form an integral part of the transistors—their control gates—two of which are represented by the metal areas 65a and 69a in FIG. 4a. In addition the metal strips 65, 67 and 69 serve to interconnect the various transistors $Q_1$ through $Q_6$. Toward this end they extend to various ones of the doped regions which form sources and drains of these transistors as shown in FIG. 4a by the extension of the metal strip 67 through an opening 69 in the oxide layer 63 to contact the N+ region 55. Completing the NOVRAM latch of FIGS. 4 and 4a are a pair of doped polysilicon floating gates 73 and 75 having small protuberances 73a and 75a where the gates dip toward the surface of the substrate to create a tunneling region, as best seen in FIG. 4a.

It will be understood, of course, that the particular integrated circuit implementation which has been described in detail with reference to FIGS. 4 and 4a is simply one of many which could be used to put the present invention into practice.

Figure 6:
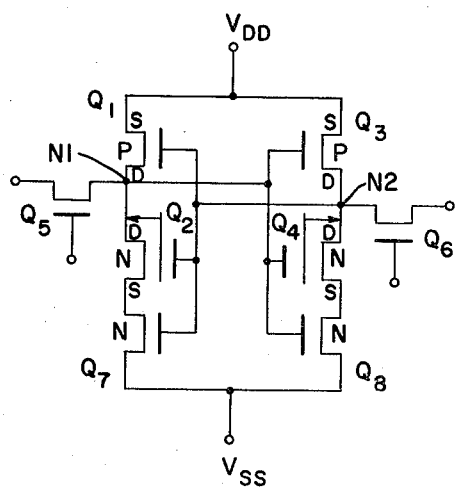
FIG. 6 is a circuit diagram of a NOVRAM circuit similar to that illustrated in FIG. 2a but with the addition of an IGFET in series with the FATMOS transistor in each branch to limit the current in that branch.
Figure 7:
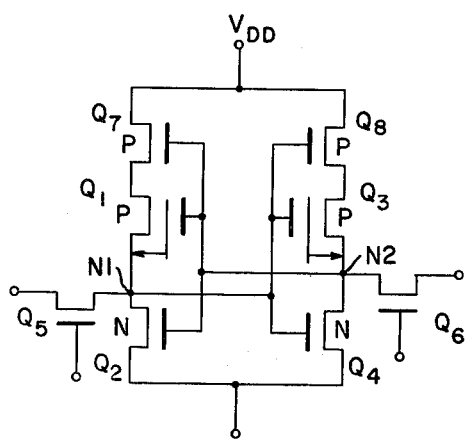
FIG. 7 is a schematic diagram of another NOVRAM embodiment similar to that of FIG. 2b but with an IGFET added to each of the FATMOS transistor loads of that circuit.

An improvement on the two basic NOVRAM latch circuits illustrated in FIGS. 2a and 2b will next be described with reference to FIGS. 6 and 7. FIG. 6 illustrates the NOVRAM latch circuit which is like that of FIG. 2a, but which has been improved over the FIG. 2a circuit by the addition, in each branch of the circuit, of an IGFET having its source-to-drain circuit connected in series with the source-to-drain circuit of the IGFET driver of that branch and its gate connected to the control gate of the IGFET driver of that branch. Thus, the additional IGFETS $Q_7$ and $Q_8$ have their source-to-drain circuits connected in series with the source-to-drain circuits of respective ones of the FATMOS transistors $Q_2$ and $Q_4$, with the gate of $Q_7$ being connected to the control gate of $Q_2$ and the gate of $Q_8$ being connected to the control gate of $Q_4$. A similar improvement over the FIG. 2b NOVRAM latch is illustrated in FIG. 7 by the addition of IGFETS $Q_7$ and $Q_8$, each having its source-to-drain circuit connected in series with that of a respective one of the FATMOS loads $Q_1$ and $Q_3$. Whereas in the FIG. 6 circuit the additional IGFETs $Q_8$ and $Q_7$, being located between the nodes $N_1$ and $N_2$ and $V_{SS}$, participate in the switching function, in the FIG. 7 circuit each forms part of the load in one of the two branches of the circuit.

The improvement which is illustrated in FIGS. 6 and 7 can be implemented not only in CMOS technology but also in NOVRAM latches using all N-channel or all P-channel technology. With CMOS technology, which is that illustrated in FIGS. 6 and 7, the load transistors (those above the nodes $N_1$ and $N_2$) are P-channel and the drivers (those transistors below the nodes $N_1$ and $N_2$) are N-channel devices. Where purely N-channel or P-channel technology is used (such as in the circuits illustrated in FIGS. 8, 9 and 10), the variable threshold transistors will always be the drivers.

Figure 8:
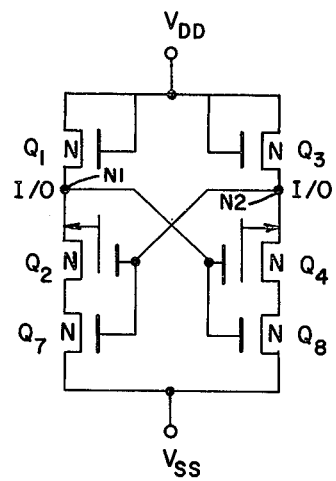
FIG. 8 is a schematic diagram of a NOVRAM in accordance with the present invention made exclusively with N-channel devices, in contrast to the circuits illustrated in FIGS. 2a, 2b, 6 and 7, in which CMOS technology was used.
Figure 9:
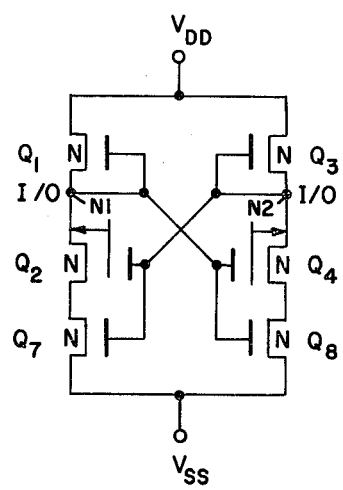
FIG. 9 is a schematic diagram of yet another NOVRAM latch incorporating features of the present invention and using N-channel technology.
Figure 10:
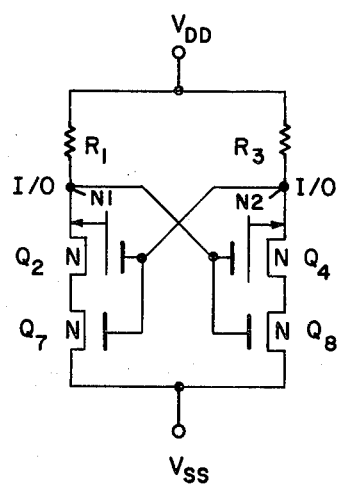
FIG. 10 is a third N-channel implementation of a NOVRAM latch in accordance with the present invention wherein both of the load devices are resistors rather than IGFETs.

Three examples of NOVRAM latch circuits using FATMOS transistors as the variable threshold voltage transistors and using an all N-channel circuit are illustrated in FIGS. 8, 9 and 10. It might be noted at this point that the Bit line transistors $Q_5$ and $Q_6$, shown with the basic NOVRAM latch circuits of FIGS. 2a and 2b, and also in the CMOS implementation of the improved NOVRAM latch circuit illustrated in FIGS. 6 and 7, have been omitted for sake of simplicity from the all N-channel implementations illustrated in FIGS. 8, 9 and 10. It should be understood that such input transistors as $Q_5$ and $Q_6$ are simply one possible means for writing into and reading from the NOVRAM latch.

The first of the all N-channel NOVRAM latch circuits, illustrated in FIG. 8, is characterized by the fact that its load transistors $Q_1$ and $Q_3$ are biased into conduction at all times since their gates are connected to the $V_{DD}$ line. However, the extent to which the load transistors $Q_1$ and $Q_3$ are turned on is much less than that to which the drivers ($Q_2$ and $Q_7$ in one branch and $Q_4$ and $Q_8$ in the other branch) are turned on. Thus, each branch functions as a voltage divider in which, when the drivers are turned on, their impedance is much less than that of the loads, so that the I/O node $N_1$ or $N_2$ will be essentially at $V_{SS}$. Conversely, when the drivers in a particular branch are turned off, their combined impedance becomes much greater than that of the load in that branch, so that the I/O node of that branch rises to practically $V_{DD}$. In short, in each branch the I/O node swings essentially between $V_{DD}$ and $V_{SS}$ as the drivers of that branch are turned off and on respectively.

While the all N-channel circuit of FIG. 8 is simpler than the CMOS circuit of FIG. 6, it draws considerably more power, due to a continuous current drain through it. The NOVRAM latch of FIG. 9 is identical to that of FIG. 8, except for two differences. First, the IGFET loads $Q_1$ and $Q_3$ of FIG. 9 are depletion type transistors, and its IGFET drivers are of the enhancement type. Secondly, the gates of the IGFET loads $Q_1$ and $Q_3$ are connected to their sources, rather than to their drains as was the case with the FIG. 8 circuit. The load transistors $Q_1$ and $Q_3$ are selected to be depletion type devices since their gate-to-source voltage is zero, which requires that their characteristic be such that at the zero gate-to-source voltage they be rendered constantly conducting. Typical thresholds for such devices are between $-0.5$ and $-3$ volts. This latch, incidentally, is similar in concept to that discussed previously with reference to FIG. 1a and may be considered to be an improvement thereon by the addition of a variable threshold transistor in series with each of the IGFET drivers $Q_2$ and $Q_4$ of FIG. 1a.

Yet another alternative to the circuits of FIGS. 8 and 9 is to simply use an integrated resistor in place of each of the IGFETs $Q_1$ and $Q_3$ as the load for the NOVRAM latch and this is illustrated in FIG. 10. A doped polycrystalline strip may, for example, be used to integrate the resistors $R_1$ and $R_3$ with the remaining components of the latch.

There was previously described in some detail, with reference to FIGS. 4 and 4a, one way in which the CMOS NOVRAM latch of FIG. 2a might be implemented. It would be relatively simple to modify that circuit so as to add the additional IGFETs, such as $Q_7$ and $Q_8$ of FIG. 6, to that integrated circuit. Indeed, three different approaches are illustrated in FIGS. 11, 11a, 12, 12a, 13 and 13a. Each of them illustrates two of the six transistors of the FIG. 6 circuit: The FATMOS $Q_2$ and the fixed threshold IGFET $Q_7$. The FATMOS $Q_2$ includes the same basic elements as were shown to form parts of the exemplary FATMOS transistor illustrated in FIGS. 3 and 3a. For ease of comparison, therefore, these elements are identified by the same reference numerals as were used for them in FIGS. 3 and 3a, except for the addition of the suffixes "a", "b", and "c" in FIGS. 11, 11a, 12, 12a, 13 and 13a, respectively. Thus, for example, in the circuits illustrated in FIGS. 11 and 11a, there are formed in a P-type silicon substrate region 21a a pair of source and drain regions 23a and 25a, which are separated by a channel region identified as $Q_2$. Supported above the channel region of $Q_2$ in an oxide layer 26a is a floating gate 33a having a small area 35a where it is very closely spaced from the surface of the drain region 25a. Overlying the floating gate 33 on the surface of the oxide 26a is a control gate 31a.

Figure 11:
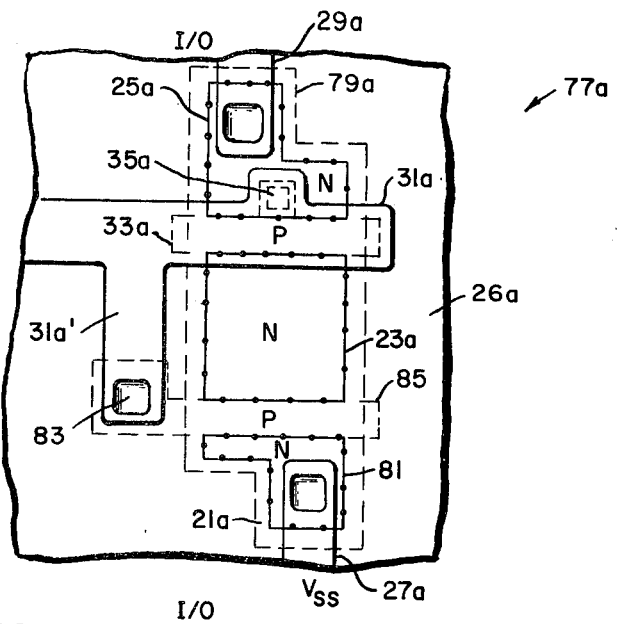
FIGS. 11, 11a, 12, 12a, 13 and 13a illustrate in plan and schematic cross-sectional views, three alternative ways for implementing the addition of an IGFET in series with a FATMOS transistor.
Figure 11A:
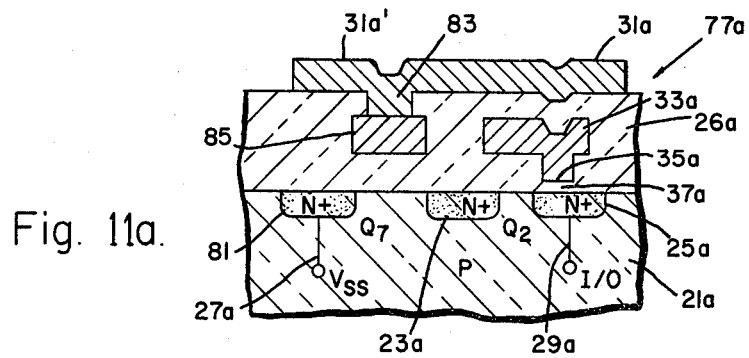

A point which is not apparent in FIG. 11a but which is shown in FIG. 11 is that the P-type region 21a is actually a part of a P-well 79a, which is formed in an N-type substrate totally surrounding that well.

To form the additional IGFET whose source-to-drain circuit will be in series with that of the FATMOS $Q_2$, an additional N+ diffusion 81 is formed at some distance from the N+ diffusion 23a which serves as the source of the FATMOS transistor $Q_2$. The P-type region between the diffusions 23a and 27a serves as the channel for the additional transistor $Q_7$, whose drain is formed by the same diffusion 23a that functions as the source of the transistor $Q_2$ and whose source is formed by the additional diffusion 81. The voltage supply $V_{SS}$ is connected to the additional diffusion 81 instead of being connected directly to the source 23a of the FATMOS transistor $Q_2$, resulting in placing the source-to-drain circuits of the two transistors $Q_7$ and $Q_2$ in series. Forming the gate of the additional IGFET $Q_7$ is a polycrystalline strip 85 supported in the oxide layer 26a at the same level as the floating gate of 33a. Contact to the gate 85 of the IGFET $Q_7$ is made from the control gate 31a by an extension 31a' thereof which makes contact with the control gate 85 of the transistor $Q_7$ through an opening 83 in the insulator 26a.

It is apparent from the foregoing brief description of the circuit illustrated in FIGS. 11 and 11a, that there is added thereby to the FATMOS $Q_2$ an additional transistor $Q_7$, whose source-to-drain circuit is in series with that of the FATMOS $Q_2$ and whose control gate is connected directly to the control gate of that transistor.

Figure 12:
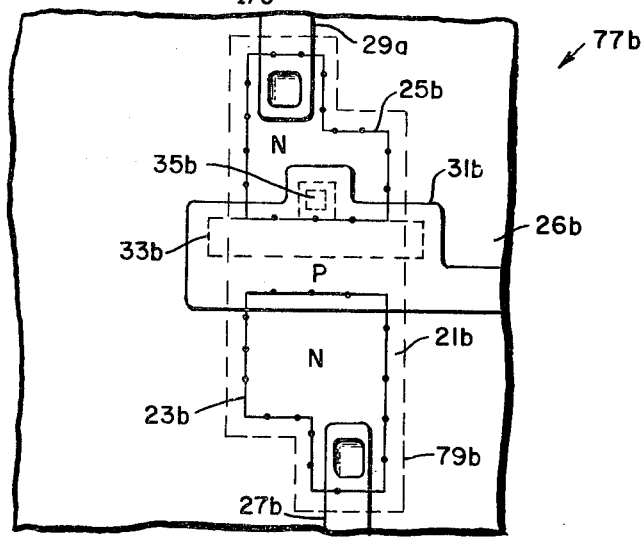
Figure 13:
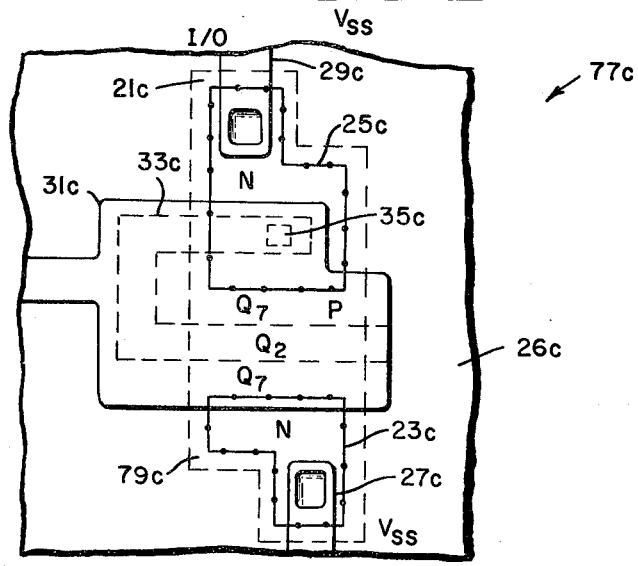
Figure 12A:
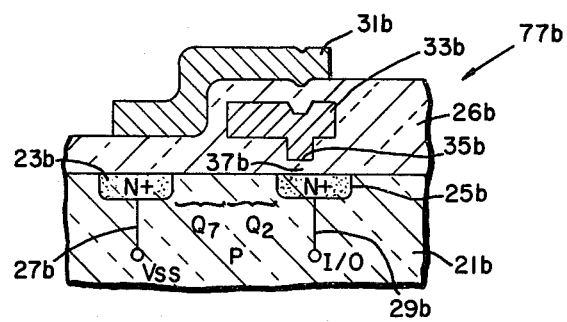
Figure 13A:
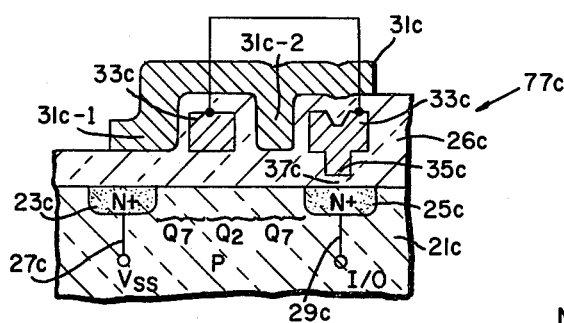

The addition of the transistor $Q_2$ in the embodiment shown in FIGS. 11 and 11a was achieved at the expense of one additional diffusion and an additional separate control gate. An alternative, whereby the additional IGFET is obtained without the addition of either, is illustrated in FIGS. 12 and 12a. This embodiment differs from the basic FATMOS shown in FIGS. 3 and 3a basically in that the channel region between the source and drain diffusions 23b and 25b serves two purposes. First, it serves as a means for modulating the impedance between the source and drain regions 23b and 25b in response to voltages on the control gate 31b and in response to charges stored permanently on the floating gate 33b in the manner described previously with reference to FIGS. 3 and 3a. Secondly, however, the same channel region also serves, in the area identified as $Q_7$, to modulate the impedance between the source and drain regions 23b and 25b in response to a voltage on the control gate 31b in a manner analogous to that of a fixed threshold IGFET since, in the region $Q_7$, the control gate 31b overlies the channel directly and is not affected by electrons stored on the floating gate 33b, which stops short of that portion of the channel. As a result, the configuration of FIGS. 12 and 12a incorporates both a fixed threshold IGFET, whose control gate is the element 31b, as well as a FATMOS whose control gate, floating gate and drain comprise the elements 31b, 33b and 25b.

A similar approach is that illustrated in FIGS. 13 and 13a, wherein again a single pair of diffusions 23c and 25c define a channel having a central portion designated as $Q_2$, and covered by one arm of a U-shaped floating polycrystalline silicon gate 33c and two edge portions, lying adjacent to the central portion, each designated as $Q_7$ and each covered by a portion of the control gate 31c. The other arm of the floating gate 33c extends over the drain diffusion 25c where it dips toward the drain to define a thin tunneling oxide area. Again, in a manner similar to that discussed with reference to FIGS. 12 and 12a, the central portion $Q_2$ of the channel functions in response to a voltage on the control gate 31c and in response charges stored on the floating gate due to tunneling from the drain 25c. At the same time, the channel regions $Q_7$ serve to modulate current flow between source and drain 23c and 25c in response to the voltage on the control gate 31c.

There are two problems encountered by the basic NOVRAM latch of the type illustrated in FIGS. 2a and 2b which are solved by the improvement just described with reference to FIGS. 6 through 13a. These problems can be overcome by other means which will also be described briefly, but the improvement under discussion offers a superior solution to them.

Figure 2B:
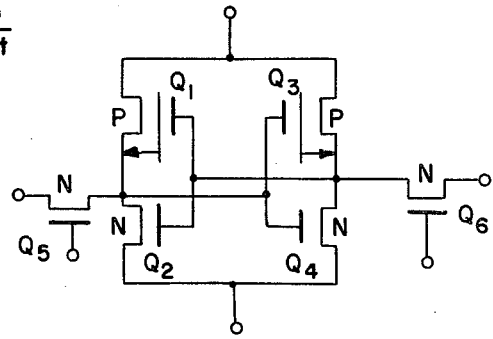
Figure 3A:
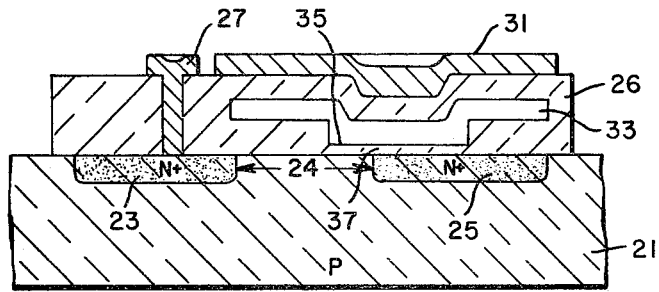

The two problems inherent in the basic NOVRAM latch of FIGS. 2a and 2b occur principally during volatile and non-volatile operation. The problem encountered during volatile operation finds its source in the non-volatile, high voltage writing operation during which the $V_{DD}$ line of the latch rises from its sub threshold-shifting level of approximately +5 volts or +10 volts to approximately +20 volts, where it remains for about 10 microseconds. During this time one of the FATMOS transistors in the latch shifts to a more positive threshold and the other to a more negative threshold. Assuming initially that they both had a threshold voltage of +0.5 volts just prior to the non-volatile writing operation, their thresholds would shift during that operation to typically +3 volts and −2 volts, respectively. The negative threshold reached by one of the FATMOS transistors will cause a significant power drain through the branch containing that transistor during the subsequent volatile operation of the latch, since that transistor will continue to conduct even with its gate at 0 volts, which is the lowest voltage its gate will ever see. The presence of an IGFET such as $Q_7$ and $Q_8$ in series with the variable threshold voltage transistor prevents this current drain because the IGFET transistors' threshold voltage is not changed by the high voltage non-volatile write operation and will typically be about +1 volt.

The current drain problem just described could be overcome by increasing the initial thresholds of the FATMOS transistors $Q_2$ and $Q_4$ to +3 volts each, so that after the non-volatile writing operation, the thresholds would be shifted to +5 volts and +1 volts, permitting both of them to continue to have positive thresholds. The achievement of higher initial threshold voltages for the FATMOS transistors $Q_2$ and $Q_4$ would not present a serious processing problem. It would, however, impose a lower limit on the power supply voltage which could be used with the circuit. Thus, if, for example, the FATMOS transistors $Q_2$ and $Q_4$ had initial thresholds of $+3$ volts and the threshold voltage of one of them would be shifted during a non-volatile write operation to $+5$ volts, then the $V_{DD}$ supply would have to be maintained at 6 volts or more for proper operation. Since the users of integrated circuits of the type contemplated here would prefer to have the flexibility of operation of anywhere within a range of about 3 volts to 15 volts, the imposition of a 6 volts minimum on the usable power supply voltage would be considered as a disadvantage by them. Of course, where such a minimum is not a disadvantage, raising the threshold voltages the FATMOS transistors $Q_2$ and $Q_4$ might be a preferred solution to the first problem, that is of excessive current drain during volatile operation.

Figure 14:
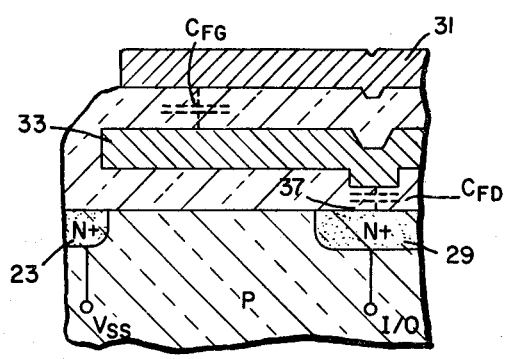
FIG. 14 is an enlarged cross section of a FATMOS transistor such as that of FIGS. 3 and 3a to illustrate some of the stray capacitances inherent in such a device.
Figure 14:
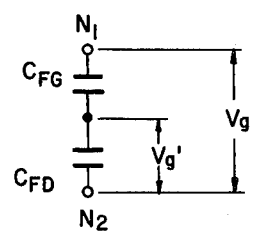

Referring now to FIG. 14, the second problem of the basic NOVRAM latch, encountered during non-volatile operation, is due to the strong capacitive coupling of the floating gate 33 of the FATMOS transistor to its drain 29 through the thin tunneling oxide area 37, this capacitance being shown in FIG. 14 as $C_{FD}$ wherein the capacitive coupling between the control gate 31 and the floating gate 33 is shown as $C_{FG}$. Shown immediately to the right of FIG. 14 is FIG. 14a, the equivalent circuit created by the capacitances $C_{FG}$ and $C_{FD}$, which are seen to be in series between the two nodes $N_1$ and $N_2$.

The effective gate voltage on the FATMOS transistor is determined by the ratio of the capacitances $C_{FG}$ and $C_{FD}$ approximately according to the equation:

$$V_g' = V_g + V_{I/O}(C_{FD}/C_{FG})$$

where $V_G$ is the control gate-to-drain voltage, as shown in FIG. 14a. Typically, the capacitance ratio $C_{FD}/C_{FG} = 1/10$.

During a high voltage non-volatile writing operation when the FATMOS transistor should be nonconducting, $V_G=0$ volts and $V_{I/O}=+20$ volts. The transistor therefore sees an effective voltage between its floating gate 33 and its drain 29 of $V_G'=0+20\times(1/10)=2.0$ volts. In other words, the two capacitances $C_{FG}$ and $C_{FD}$ act as a voltage divider across the nodes $N_1$ and $N_2$ so that a portion of that voltage, determined by the ratio of the capacitances, will appear between the midpoint (the floating gate) and one end (the drain) of the divider.

Assume, for example, that the FATMOS under consideration is $Q_4$ of FIG. 2a and that, just prior to the non-volatile writing operation, it was nonconductive. Then, since the nodes $N_1$ and $N_2$ will rise from zero and $+10$ volts to 0 and $+20$ volts, respectively, the threshold voltage of $Q_4$ will be shifted to about $-2$ volts, due to the net minus 20 volts on its control gate (connected to $N_1$) relative to its drain (connected to $N_2$). At the same time the effective voltage on its floating gate 33 will be about $+2.0$ volts (because of the $+20$ volts on its drain) which will have a tendency to induce conduction between the source 23 and drain 29 of the transistor. The combined effect of a negative threshold and a positive voltage on the floating gate will be to cause heavy conduction in the FATMOS transistor $Q_4$ and, since its associated load transistor $Q_3$ is also in conduction, a heavy current will be drawn by the branch containing those two transistors.

In addition to the increased power consumption caused by the current drain during non-volatile write operation, the current drain also results in adversely affecting the operation of the latch. This is due to the fact that the node $N_2$, which would ideally be at a voltage level $V_{DD}$ if the transistor $Q_4$ remained cut off, will in fact drop from that level toward the level of $V_{SS}$ or from a level of $+20$ volts toward 0 volts. The exact voltage will depend of course upon the ratio of the impedances of $Q_3$ and $Q_4$ and this will be determined by the extent to which $Q_4$ has been turned on as a result of the combined effects of its negative threshold and of the effective voltage on its floating gate. Since the voltage across the control gate and drain of the other FATMOS transistor $Q_2$ is the difference between the voltages on the two nodes $N_1$ and $N_2$, the extent of the threshold voltage shift in $Q_2$ will be diminished.

This second problem is also solved by the addition of the IGFETs $Q_7$ and $Q_8$, since their threshold voltages remain at 0 volts even when their associated FATMOS transistors, threshold voltages are changed. Thus, in the case just discussed, where the threshold voltage of $Q_4$ was shifted to $-2$ volts, that of its associated series IGFET $Q_8$ (see FIG. 6) would remain above 0 volts and, since the voltage on the node $N_1$ is 0 volts, the transistor $Q_8$ would remain cut off throughout the non-volatile writing operation. Consequently, the voltage at $N_2$ would remain at $V_{DD}$ so that the effectiveness of shifting the threshold of the FATMOS transistor $Q_2$ would be uneffected and there would be practically no current drain through either branch of the latch during the non-volatile writing operation.

The great advantage of implementing the NOVRAM latch of the present invention in CMOS technology, as shown in its basic form in FIGS. 2a and 2b, is that when the load transistor of a given branch conducts, its associated driver transistor is cut off so that, except during switching of the latch from one of its states to its opposite state, it draws no current. It is this advantage which is restored, or preserved, by the addition of the series IGFETs $Q_7$ and $Q_8$ which insure that, when a particular one of the FATMOS drivers $Q_2$ and $Q_4$ is supposed to be off, it is indeed off. By so preserving the basic characteristics of the CMOS NOVRAM latch, the embodiments illustrated in FIGS. 6 and 7 make it possible to accomplish the non-volatile writing operation with extremely small amounts of power, since all that is required during the non-volatile operation when the voltage on $V_{DD}$ is raised from $+10$ volts to $+20$ volts is to supply the extra charge required by the capacitances in the latch. This extra charge is very small, and once it has been supplied, there is no further power drain by the circuit. Therefore, it becomes possible to use a single pre-charged capacitor (to $+20$ volts) to supply the power necessary to effect non-volatile writing of the information contained in an entire array of NOVRAM latch circuits. The non-volatile writing operation is achieved by simply discharging the single storage capacitor onto the capacitances of the NOVRAM latches comprising the array. Since none of the latches reverses its state during the non-volatile writing operation, no current is dissipated in any of the latches, the only current required being that necessary to charge their capacitances. The storage capacitor could be either on the integrated circuit chip in which the NOVRAM latch circuits are formed or, where such a capacitor cannot store all of the required charge, it can be formed externally of that chip. This low power storage feature is not available with the prior art latch of FIG. 1b, where raising of the $V_{GG}$ line to +25 volts causes the two MNOS load transistors to be highly conducting and therefore to dissipate a great deal of power, requiring an expensive dedicated high voltage power supply.

It should be noted that the improvement described with reference to FIGS. 6 and 7 is not an absolute necessity in all cases and that the basic NOVRAM latch circuits of FIGS. 2a and 2b could be used without the additional transistors $Q_7$ and $Q_8$ by solving the second described problem (turn-on voltage due to $C_{FD}$) through alternative means. For example, the capacitance $C_{FD}$ between the drain and the floating gate could be reduced relative to the capacitance $C_{FG}$ between the floating gate and the control gate so as to increase the ratio $C_{FG}/C_{FD}$ from 10-to-1 to 25-to-1 or 100-to-1. This would have the effect of minimizing the voltage $V_G'$, created across the floating gate and the drain of the FATMOS by the voltage dividing effect described with reference to FIG. 14a. This could be accomplished either by increasing the size of the floating gate 33 and of the control gate 31 so as to maximize the capacitance $C_{FG}$, or by reducing to an absolute minimum the size of the tunneling oxide area 37. The improvement described with reference to FIGS. 6 through 13a, however, is superior to the manipulation of the sizes and dimensions of the control and floating gates 31 and 33 in that it does not require either an increase in the size of the FATMOS transistors, as would be the case if the gates were enlarged, and it does not require undue restriction on the area permitted for the tunneling oxide 37. While it is desired, in order to minimize pinholes, to make the tunneling oxide area 37 as small as possible, there are practical limits on just how small it can be made.

In summary, by adding a pair of transistors $Q_7$ and $Q_8$, which is shown by FIGS. 11 through 13a to be very simply accomplished in any of several ways, both of the problems inherent in the basic NOVRAM latch are solved, enabling the latch to perform in its ideal operating mode in which it draws no current other than that required to charge its capacitances during the non-volatile writing operation and in which it draws no current whatever during its volatile operating mode, except during switching.

It will be apparent upon inspection that, various all N-channel circuits, three of which are shown in FIGS. 8, 9 and 10, also benefit from the addition of IGFETs in series with their FATMOS transistors $Q_2$ and $Q_4$. Thus, all of them would, without the addition of the transistors $Q_7$ and $Q_8$,

| | | |
|---|---|---|
| x | x | x |
| x | x | x |
| x | x | x |
| x | x | x |
| x | x | x |
| x | x | x |
| x | x | x |
| x | x | x |
| x | x | x |
| x | x | x |
| x | x | x |
| x | x | x |
| x | x | x |
| x | x | x |

-continued

| | | |
|---|---|---|
| x | x | x |
| x | x | x |
| x | x | x | operate less effectively because of the CFD-induced problem described previously with reference to FIGS. 14 and 14a.

Turning next to FIGS. 15 through 18, yet another improvement on the previously discussed embodiments of the NOVRAM latch will be described. Each of the improved NOVRAM latch circuits of FIGS. 15 through 18 shares the common feature of achieving non-volatility in the NOVRAM latch with a single FATMOS transistor instead of two. This in turn yields two major advantages. The first advantage derives from the fact that the thin oxide used for tunneling of charge onto the floating gate of a FATMOS is a major yield-reducing factor, particularly in very large memory arrays where a single pinhole in one of the thin oxide areas of array of latches is sufficient to ruin an entire chip. Use of a single FATMOS in place of two per NOVRAM latch cuts in half the total area of the thin tunneling oxide for the memory array. Secondly, FATMOS transistors require approximately twice the silicon area used for fixed threshold transistors. Elimination of one of the two FATMOS transistors from the NOVRAM latch reduces its size, thus further increasing the yield.

The achievement of the non-volatility function with a single FATMOS transistor does require better control of the manufacturing process. This is apparent when one considers that, in the basic NOVRAM cell of FIG. 2a, non-volatile write operation causes the threshold voltage of one of the FATMOS transistors ($Q_2$) to rise while dropping the threshold voltage of the other FATMOS transistor ($Q_4$) by an equal amount. Thus, in the basic NOVRAM latch of FIG. 2a (and the same comments also apply to FIG. 2b) what really matters is the relative difference in the thresholds in the variable threshold transistors $Q_2$ and $Q_4$. Their absolute threshold voltages, which are a function of processing parameters, are not critical. In the improved NOVRAM latch as illustrated in FIGS. 15 through 18, on the other hand, one of the previously variable threshold transistors ($Q_4$) has a fixed threshold and therefore non-volatile write operation in such a latch requires that the variable threshold FATMOS transistor $Q_2$ its threshold voltage brought to a level either above or below that of $Q_4$. Thus, the absolute value of the threshold voltage of the single FATMOS transistor becomes important and requires tighter processing control as well as a tighter control on the magnitude of the high voltage write pulse.

This last point may be further clarified by considering the circuit of FIG. 15, which is the same as that of FIG. 2a, except that only the transistor $Q_2$ is a FATMOS, and assuming that the now fixed threshold transistor $Q_4$ has a threshold voltage of a +1 volt. In order that data might be unambiguously stored in the latch, the two threshold voltage levels of the FATMOS $Q_2$ will have to be higher than 1.5 volts and lower than 0.5 volts, respectively. That is, in one of its states the threshold voltage of the FATMOS $Q_2$ will have to be at least by 0.5 volts more positive than that of $Q_4$, and in its other state the threshold voltage of $Q_2$ will have to be at least 0.5 volts more negative than that of $Q_4$. It is totally impermissible for the threshold voltage of the FAT- MOS $Q_2$ to move between two levels, both of which are either higher than or lower than the threshold voltage of $Q_4$, since that would result in the latch assuming the same state after application of power following a non-volatile write for both of the FATMOS threshold voltages.

Having stated the requirements for closer processing control for the accomplishment of the required FATMOS threshold voltages it is fair to state that its achievement does not present a serious problem.

Provided that the above described threshold voltage requirements for the FATMOS transistor $Q_2$ are met, the circuit of FIG. 15 will be capable of both volatile and non-volatile information storage, with the subsequent ability to recall information in response to the pulsing of the voltage level on the line $V_{DD}$ in the same manner as described for the basic two-FATMOS NOVRAM latch of FIG. 2a.

Figure 17:
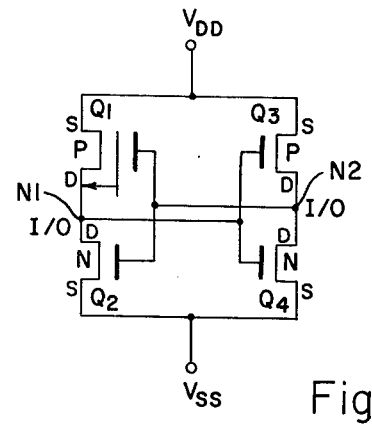
FIG. 17 is a schematic diagram of a NOVRAM latch which is similar to that illustrated in FIG. 2b but is an improvement thereon in that only one of the IGFET loads has a variable threshold voltage.

In a manner analogous to that described for FIG. 15, the other basic NOVRAM latch circuit of FIG. 2b can be modified so as to use only a single FATMOS as illustrated in FIG. 17.

Figure 16:
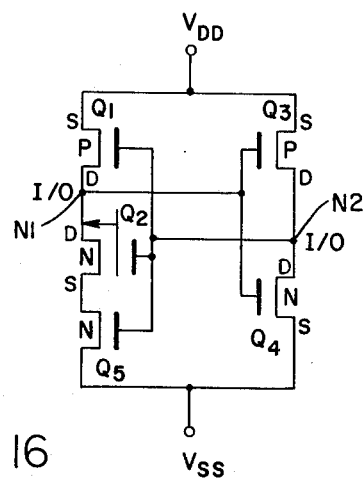
FIG. 16 is a schematic diagram of a latch circuit basically like that illustrated in FIG. 15 but further improved by the addition of an IGFET transistor in series with the single variable threshold voltage transistor of that circuit to limit current in the branch containing that transistor.
Figure 18:
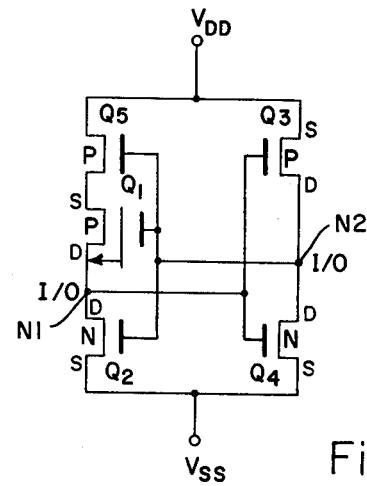
FIG. 18 is a schematic diagram of a NOVRAM latch which incorporates the improvement of the circuit illustrated in FIG. 17 in that it has only a single variable threshold voltage (shown as a FATMOS) transistor load but is a further improvement thereon by incorporating an additional IGFET transistor in series with the FATMOS load transistor to limit current in the branch containing that transistor.

Both of the improved circuits of FIGS. 15 and 17 are amenable to improvement by the addition of an IGFET transistor with a fixed threshold voltage in series with their single FATMOS transistor, in a manner analogous to that described previously with reference to the NOVRAM latch circuits of FIGS. 6 and 7. The advantages of adding a fixed threshold IGFET in series with a variable thershold FATMOS transistor will be similar to those described previously with reference to FIGS. 6 and 7. One caution that needs to be observed for the additional fixed threshold transistor identified as $Q_5$ in both FIGS. 16 and 18, is that (with particular reference now to FIG. 16) the threshold voltage of $Q_4$ must be at least approximately 0.5 volts higher than that of $Q_5$. Otherwise, if the threshold voltages of $Q_4$ and $Q_5$ were less than 0.5 volts apart, the latch would rise after a non-volatile write operation in an ambiguous state if the non-volatile writing operating had resulted in placing $Q_2$ in its low threshold voltage (conducting) state. The reason for this is that, when the FATMOS transistor $Q_2$ conducts, its impedance is negligible. Therefore, the state which the latch will assume under that condition will be determined by the relative impedances of $Q_4$ and $Q_5$. If their impedances were approximately the same, because they had the same threshold voltages, the state of the latch would be ambiguous.

To help clarify this last point, assume hat $Q_2$ has a low threshold voltage of 0 volts and a high threshold voltage of $+3$ volts and that the threshold voltages of $Q_5$ and $Q_4$ are $+1$ volt and $+1.5$ volts, respectively. Assume further that, initially the threshold voltage of $Q_2$ had been set at $+3$ volts during the non-volatile writing operation, after which power had been removed from the latch. When power is next applied, as for example at time $t_3$ in FIG. 5, the branch containing the FATMOS transistor $Q_2$ will not conduct because of its high threshold voltage. Consequently, the node $N_1$ will rapidly rise to $V_{DD}$ and will turn on the transistor $Q_4$. As that transistor turns on, the node $N_2$ of its branch drops to $V_{SS}$, which further turns off both $Q_2$ and $Q_5$.

Figure 5:
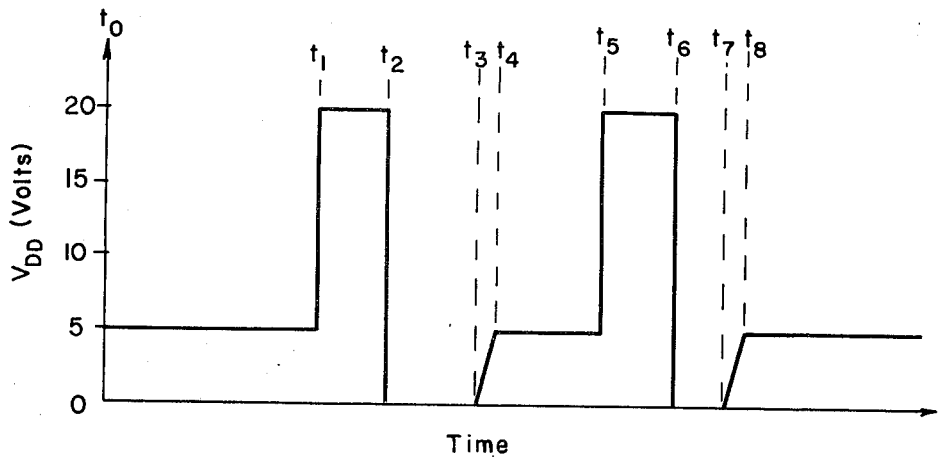
FIG. 5 is a timing diagram illustrating the voltages which are applied across the two branches of the latch circuits illustrated in FIGS. 2a and 2b for volatile and non-volatile storage operation.

Assume next that, during the non-volatile writing operation, just prior to loss of power (FIG. 5: $t_1-t_2$), the threshold voltage of $Q_2$ had been set at its lower level of 0 volts. Now, when power is reapplied, (at time $t_3$) $Q_2$ will be the first to turn on because of its low threshold voltage, and it will contribute negligible impedance to its branch. At this point it is still undetermined which of the transistors $Q_4$ and $Q_5$ will turn on, and hence which branch of the latch will conduct. This will be determined by the relative thresholds of $Q_4$ and $Q_5$. And, since the threshold of $Q_4$ is higher, $Q_5$ will be the first to turn on. With $Q_2$ already conducting, the branch containing $Q_2$ and $Q_5$ will now rapidly drop the node $N_1$ of their branch to $V_{SS}$ and this will firmly turn off $Q_4$, bringing its node $N_2$ to $V_{DD}$.

Thus, by selecting the threshold voltage of $Q_4$ so as to be slightly higher than that of $Q_5$, the latch will be consistently switched to one state or the other depending solely upon the threshold voltage level of the FATMOS transistor $Q_2$.

The same parameters and advantages also apply to the circuit of FIG. 18 which is an improvement over that of FIG. 17, in that the FIG. 18 circuit includes the additional IGFET transistor $Q_5$ in series with the variable FATMOS transistor $Q_1$. For the same reason as just explained with reference to FIG. 16 the threshold voltage of $Q_3$ should be at least 0.5 volts higher than that of $Q_5$.

The last to be described improvement of the NOVRAM latch is that illustrated schematically in FIGS. 19 and 21, with plan and cross-sectional views of an integrated circuit implementation appearing in FIGS. 20 and 20a. Referring first to FIG. 19, it is essentially an improvement over the single-FATMOS NOVRAM latch of FIG. 15. Assume that, in the previously discussed latch of FIG. 15, $Q_4$ rather than $Q_2$ is the single FATMOS transistor, which is an equivalent alternative to that shown in FIG. 15. The circuit of FIG. 19 differs from that assumed single-FATMOS latch by sharing its floating gate with its associated IGFET $Q_3$. The resulting circuit, shown in FIG. 19, enjoys the advantages of the FIG. 15 circuit (and its equivalent) which derive from the fact that the FIG. 19 circuit has only a single tunneling oxide area. Yet, it is superior to the FIG. 15 (and its equivalent) circuit because both of the transistors $Q_3$ and $Q_4$ in its right-hand branch have variable thresholds whose shifts, in response to a given non-volatile writing pulse, will reinforce each other, because of their opposite conductivity types.

Before going into detail as to the manner in which the FIG. 19 improved NOVRAM latch operates, the manner in which the transistors $Q_3$ and $Q_4$ might be fabricated will be explained with reference to FIGS. 20 and 20a. Consistent with the implementation of the basic circuit as illustrated in FIGS. 4 and 4a, the transistors $Q_3$ and $Q_4$ are seen formed in an N-type substrate 91 in which there has been formed a P well 93. A P+ doped guard band 95 is formed in the substrate surface at the P/N junction formed by periphery of the P well 93 and substrate 91. N+ source and drain regions 97 and 99 formed in the P well 93 define the N channel transistor $Q_4$ and P+ source and drain regions 101 and 103 in the N substrate 91 define the P channel of the transistor $Q_3$. Covering the surface of the substrate 91 is an insulating layer 105 (oxide/nitride or nitride being preferred, but all oxide also be acceptable) which is thinned over the doped regions 97 and 103 to facilitate the making of contacts 107 and 109 thereto through openings in the oxide. The contact 107 serves to bring the $V_{SS}$ line to the source 97 of $Q_4$ and the contact 109 serves to bring the $V_{DD}$ line to the source of $Q_3$. Buried in the insulating layer 105 is a floating gate 111 having two legs 111a and 111b extending from a common trunk to a position between the N+ regions 97, 99 and the P+ regions 101, 103, respectively. The first branch 111a of the floating gate is provided with a small "spot" where it extends vertically down toward the substrate 91. This spot is located preferably over the drain diffusion 99 of the transistor $Q_4$.

Disposed on the surface of the insulating layer 105 is a control gate 115 which extends generally above the floating gate 111 and which also has two arms 115a and 115b, also extending from a common trunk, and serving as the control gates for the transistor $Q_4$ and $Q_3$, respectively. Completing the construction of the transistors $Q_3$ and $Q_4$ is a metal strip 118 which extends at its opposite ends through contacts 117 and 119 to respective ones of the $Q_4$ and $Q_3$ drain diffusions 99 and 101. The metal strip 118 thus interconnects the transistors $Q_3$ and $Q_4$ at their drains, thus forming the I/O node N2 of their branch. The strip 118 is provided with an extension 118a which serves to connect the I/O node to the gates of the transistors $Q_1$ and $Q_2$ (not shown in FIGS. 20 and 20a).

Inspection of FIGS. 20 and 20a reveals a pair of opposite conductivity type IGFETS compactly arrayed and sharing a single floating gate as well as a single control gate, with the floating gate having only a single tunneling oxide area, defined by the extension of 113 of that gate. So long as normal (sub-threshold shifting) voltage levels are applied to the circuit between $V_{SS}$ and $V_{DD}$, the two transistors $Q_3$ and $Q_4$ operate as a CMOS inverter. When the voltage $V_{DD}-V_{SS}$ is raised to approximately +20 volts, however, tunneling occurs through the thin tunneling oxide area over the $Q_4$ drain 99, causing charges to accumulate on the floating gate 111. This has the same physical effect on the channel areas of both transistors $Q_3$ and $Q_4$. In both of these channel areas there will be fewer electrons than there would be in the absence of electrons on the floating gate, due to the repelling effect of electrons on the floating gate on electrons in the channel regions of the the transistors $Q_3$ and $Q_4$. However, because the transistors $Q_3$ and $Q_4$ have opposite conductivity types, this electron deficit will have opposite effects on their operation. The threshold of $Q_3$ will be reduced (rendering it more conductive) while that of $Q_4$ will be increased (rendering it less conductive) by roughly equal amounts.

Assume for example, with reference to FIG. 19, that initially $Q_1$ and $Q_3$ have P channel voltages of −1 volt and that the N channel thresholds of $Q_2$ and $Q_4$ are +1 volt. Following a non-volatile write operation during which the $V_{DD}$ supply is raised to approximately +20 volts for about 10 microseconds, the floating gate 111 will have either more or less electrons stored on it, depending on the state of the latch before $V_{DD}$ was raised. Assuming that there will be more electrons on the floating gate 111, the thresholds of $Q_3$ and $Q_4$ will change by the same magnitude, with the threshold of $Q_3$ dropping and that of $Q_4$ rising. Typical values would be +3 volts for the threshold of $Q_4$ and +1 volt for that of $Q_3$. As a result, when power is reapplied to the NOVRAM latch of FIG. 19, its state will be determined by the new thresholds of both $Q_3$ and $Q_4$ and it will be determined more positively than it will with the circuit of FIG. 15. Thus, what has been achieved is essentially a NOVRAM latch with two transistors having FATMOS characteristics, but sharing a single tunneling oxide region.

Since the improved NOVRAM latch of FIG. 19 may still be subject to the drawback of excessive drain current and diminished operating effectiveness if either of the transistors $Q_3$ or $Q_4$ has had its threshold voltage shifted so that it conducts even when the voltage on its control gate is 0 (depletion mode conduction), the addition of an IGFET in series with each of the transistors $Q_3$ and $Q_4$ will yield the same benefits as those described previously, in particular with reference to FIGS. 6 and 7. Such a modification is shown in FIG. 21 which is identical to the circuit of FIG. 19, except that a P channel transistor $Q_5$ has been connected with its source-to-drain circuit in series with that of the P channel load transistor $Q_3$ and an additional N channel IGFET $Q_6$ has been added with its source-to-drain circuit in series with that of the driver transistor $Q_4$. The additional transistors $Q_5$ and $Q_6$ should have the same thresholds as $Q_1$ and $Q_2$, respectively and with such thresholds they will be effective in preventing power drain from $V_{DD}$ to $V_{SS}$ which might otherwise occur during those times when either $Q_3$ or $Q_4$ has had its threshold shifted so as to cause the transistor to operate in the depletion mode.

From the foregoing it will be apparent that there has been contributed to the art a latch circuit capable of both volatile and non-volatile information storage which has several significant advantages over devices of the prior art, extending their utility into areas not heretofore thought possible. Among the principal advantages of the present invention over the prior art are that it can: (1) be implemented using CMOS circuitry, resulting in minimal current drain; (2) be operated both in the volatile and non-volatile information storage mode without requiring any extra lines; (3) be made by using only a single variable threshold device per latch; (4) switch from a volatile to a non-volatile storage mode in response to a single pulse; and (5) carry out a non-volatile storage operation without the need for a separate erasing of the previous non-volatile information, since each non-volatile write operation automatically erases the results of the last such operation.

Various modifications of the invention will become apparent to those skilled in the art. Thus, it will be apparent that, although the novel latch circuit of the present invention has been described primarily as it would be used in a random access memory array, it could equally be used in other electrically programmable circuit arrangements. Examples of such circuits are shift registers, pre-settable counters, programmable filters and random logic arrangements where the novel latch would be interspersed among ordinary (non-programmable) logic elements and would achieve a preferred logic operation which is electrically alterable at will.

What is claimed is:

1. An integrated semiconductor memory array comprising in combination:
   (a) a plurality of latch circuits arranged in columns and rows, each latch circuit having a pair of branches, each branch comprising an IGFET driver and an IGFET load connected in series drain-to-drain at a common node, the control gate of the IGFET driver of each branch of a latch being connected to the node of the other branch of that latch, at least one IGFET of each latch having a variable threshold voltage;
   (b) means for normally maintaining a first voltage across the two branches of all of said latches which is below that required to change the thresholds of the variable threshold IGFETs of those branches;

(c) means for applying an input signal to at least one node of each latch in a selected column so as to store information in said latch in volatile form;

(d) means for selectively enabling all latches in a given row to receive said input signals so that, by means of the last two named means any one or more of said latches may be selected to receive information in volatile form, thereby achieving volatile storage of information in all of said selected latches;

(e) means for temporarily raising the voltage across all of said branches a second, higher, level which is sufficient to cause a long term change in the thresholds of all of said variable threshold transistors, thereby achieving non-volatile storage of the volatile information in all of said latches; and (f) means for applying substantially identical voltages to both nodes of at least one selected latch, while maintaining said first voltage across all of said latches, for selectively obliterating the volatile information content of only said selected latch, resulting in said selected latch assuming the state dictated by the threshold state of its at least one variable threshold IGFET without disturbing the volatile information contents of non-selected latches.

2. The memory array of claim 1 characterized further in that the IGFET drivers in each latch have oppositely variable thresholds.

3. The memory array of claim 1 characterized further in that said at least one IGFET driver in each latch has a floating gate with a thin oxide area at least partially over the node to which said IGFET driver is connected.

4. The memory array of claim 1 further characterized in that the IGFET loads in each latch have oppositely variable thresholds.

5. The memory array of claim 1 characteriazed further in that each IGFET load in each latch has a floating gate with a thin oxide area at least partially over the node to which said IGFET load is connected.

* * * * *